(12) United States Patent
Sun et al.

(10) Patent No.: US 10,220,954 B2
(45) Date of Patent: Mar. 5, 2019

(54) AERIAL SYSTEM THERMAL CONTROL SYSTEM AND METHOD

(71) Applicant: Hangzhou Zero Zero Technology Co., Ltd., Hangzhou, Zhejiang Prov. (CN)

(72) Inventors: Wei Sun, Hangzhou (CN); Tong Zhang, Hangzhou (CN); Mengqiu Wang, Hangzhou (CN)

(73) Assignee: Zero Zero Robotics Inc, Wilmington, DE (US)

( * ) Notice: Subject to any disclaimer, the term of this patent is extended or adjusted under 35 U.S.C. 154(b) by 0 days.

(21) Appl. No.: 15/495,645

(22) Filed: Apr. 24, 2017

(65) Prior Publication Data

US 2017/0225796 A1 Aug. 10, 2017

Related U.S. Application Data

(63) Continuation-in-part of application No. 15/349,749, filed on Nov. 11, 2016, now Pat. No. 9,836,053, (Continued)

(30) Foreign Application Priority Data

Aug. 10, 2015 (CN) .......................... 2015 1 0487412
Aug. 10, 2015 (CN) .......................... 2015 1 0487415
(Continued)

(51) Int. Cl.
*B64D 33/08* (2006.01)
*B64C 39/02* (2006.01)
(Continued)

(52) U.S. Cl.
CPC ............. *B64D 33/08* (2013.01); *B64C 15/12* (2013.01); *B64C 39/024* (2013.01); *B64D 47/08* (2013.01);
(Continued)

(58) Field of Classification Search
CPC .................................................... B64D 33/08
See application file for complete search history.

(56) References Cited

U.S. PATENT DOCUMENTS 3,083,935 A 4/1963 Piasecki
4,043,421 A 8/1977 Smith
(Continued)

FOREIGN PATENT DOCUMENTS

CH 333967 11/1958
CN 101976078 2/2011
(Continued)

OTHER PUBLICATIONS

EP15875205.5 Search Report dated Dec. 22, 2017, 7 pages.
International Search Report for PCT Application No. PCT/IB2018/000174 dated Jun. 27, 2018.

*Primary Examiner* — Alex C Dunn
(74) *Attorney, Agent, or Firm* — Jeffrey Schox

(57) ABSTRACT

An aerial vehicle including a set of rotors, a processor configured to configured to control the set of rotors for aerial vehicle flight, and a housing defining a plurality of cooling channels, wherein, for each rotor of the set, a projection of the processor and the cooling channels onto the respective rotor plane does not intersect the swept area of the rotor, and a distance from the rotor axis of a first rotor of the set to a cooling channel is less than 75% of a rotor diameter of the first rotor. A method for aerial vehicle operation, including providing an aerial vehicle including a rotor, a processor, and a housing, flying the aerial vehicle, and, while flying the aerial vehicle, actively cooling the processor, including, at the rotor, forcing airflow toward the processor.

19 Claims, 9 Drawing Sheets

Related U.S. Application Data which is a continuation-in-part of application No. PCT/CN2016/070583, filed on Jan. 11, 2016, and a continuation-in-part of application No. PCT/CN2016/070579, filed on Jan. 11, 2016, and a continuation-in-part of application No. PCT/CN2016/070581, filed on Jan. 11, 2016, and a continuation-in-part of application No. PCT/CN2015/099339, filed on Dec. 29, 2015.

(60) Provisional application No. 62/353,337, filed on Jun. 22, 2016, provisional application No. 62/353,344, filed on Jun. 22, 2016, provisional application No. 62/326,792, filed on Apr. 24, 2016, provisional application No. 62/326,600, filed on Apr. 22, 2016, provisional application No. 62/099,512, filed on Jan. 4, 2015.

(30) Foreign Application Priority Data

| Aug. 10, 2015 | (CN) | .......................... 2015 1 0487744 |
| Aug. 31, 2015 | (CN) | .......................... 2015 1 0547151 |

(51) Int. Cl.

| *B64D 47/08* | (2006.01) |
| *B64C 15/12* | (2006.01) |
| *H05K 7/20* | (2006.01) |
| *H01L 23/467* | (2006.01) |
| *H01L 23/367* | (2006.01) |

(52) U.S. Cl.
CPC ........ *H01L 23/3675* (2013.01); *H01L 23/467* (2013.01); *H05K 7/20154* (2013.01); *H05K 7/20209* (2013.01); *B64C 2201/027* (2013.01); *B64C 2201/042* (2013.01); *B64C 2201/108* (2013.01); *B64C 2201/14* (2013.01); *B64C 2201/182* (2013.01)

(56) References Cited

U.S. PATENT DOCUMENTS

| 5,351,913 | A | * | 10/1994 | Cycon | ..................... B64C 27/20 244/12.2 |
| 5,419,514 | A | | 5/1995 | Duncan | |
| 5,503,351 | A | * | 4/1996 | Vass | ..................... B64C 39/064 244/12.2 |
| 5,672,086 | A | | 9/1997 | Dixon | |
| 5,890,441 | A | | 4/1999 | Swinson et al. | |
| 6,260,796 | B1 | | 7/2001 | Klingensmith | |
| 6,270,038 | B1 | * | 8/2001 | Cycon | ..................... B64C 27/20 244/12.2 |
| 6,293,491 | B1 | | 9/2001 | Wobben | |
| 6,547,180 | B1 | | 4/2003 | Cassidy | |
| 6,688,936 | B2 | | 2/2004 | Davis | |
| 6,694,228 | B2 | | 2/2004 | Rios | |
| 6,745,977 | B1 | | 6/2004 | Long et al. | |
| 6,773,321 | B1 | | 8/2004 | Urquiaga | |
| 6,928,363 | B2 | | 8/2005 | Sankrithi | |
| 7,011,274 | B1 | | 3/2006 | Hardoin | |
| 7,341,223 | B2 | | 3/2008 | Chu | |
| 7,343,232 | B2 | | 3/2008 | Duggan et al. | |
| 7,429,997 | B2 | | 9/2008 | Givon | |
| 7,542,828 | B2 | | 6/2009 | Steele et al. | |
| 7,712,701 | B1 | * | 5/2010 | Ehrmantraut | ........... B64C 27/20 244/17.23 |
| 8,177,159 | B2 | | 5/2012 | Khakimov et al. | |
| 8,275,412 | B2 | | 9/2012 | Alameh et al. | |
| 8,346,480 | B2 | | 1/2013 | Trepagnier et al. | |
| 8,430,709 | B1 | | 4/2013 | Wong | |
| 8,473,123 | B2 | | 6/2013 | Sun et al. | |
| 8,564,148 | B1 | | 10/2013 | Novak | |
| 8,590,829 | B2 | | 11/2013 | Keidar et al. | |
| 8,620,493 | B2 | | 12/2013 | Hughes et al. | |
| 8,903,568 | B1 | | 12/2014 | Wang et al. | |
| 8,907,846 | B2 | | 12/2014 | Sharawi et al. | |
| 8,938,160 | B2 | | 1/2015 | Wang | |
| 8,958,928 | B2 | | 2/2015 | Seydoux et al. | |
| 9,004,393 | B2 | | 4/2015 | Barrett-Gonzales | |
| 9,004,396 | B1 | | 4/2015 | Colin et al. | |
| 9,079,115 | B2 | | 7/2015 | Huang et al. | |
| 9,085,355 | B2 | | 7/2015 | Delorean | |
| 9,108,729 | B2 | | 8/2015 | Duggan et al. | |
| 9,126,693 | B1 | | 9/2015 | Shi et al. | |
| D741,751 | S | | 10/2015 | Klaptocz et al. | |
| 9,174,732 | B2 | | 11/2015 | Jensen et al. | |
| 9,266,609 | B1 | | 2/2016 | Kunz | |
| D751,025 | S | | 3/2016 | Howell et al. | |
| 9,277,130 | B2 | | 3/2016 | Wang et al. | |
| 9,290,267 | B2 | | 3/2016 | Metreveli | |
| 9,305,317 | B2 | | 4/2016 | Grokop et al. | |
| 9,317,036 | B2 | | 4/2016 | Wang et al. | |
| 9,321,531 | B1 | * | 4/2016 | Takayama | ................ B64D 1/12 |
| 9,346,543 | B2 | | 5/2016 | Kugelmass | |
| 9,364,930 | B2 | | 6/2016 | Hethcock et al. | |
| 9,402,008 | B2 | | 7/2016 | Chen et al. | |
| 9,429,141 | B2 | | 8/2016 | Vander Lind et al. | |
| 9,457,899 | B2 | | 10/2016 | Duffy et al. | |
| 9,493,235 | B2 | | 11/2016 | Zhou et al. | |
| 9,527,597 | B1 | | 12/2016 | Sada et al. | |
| 9,550,567 | B1 | | 1/2017 | Erdozain et al. | |
| 9,567,076 | B2 | * | 2/2017 | Zhang | ....................... B64C 1/00 |
| 9,589,595 | B2 | | 3/2017 | Gao et al. | |
| 9,625,907 | B2 | | 4/2017 | Hu et al. | |
| 9,630,710 | B2 | | 4/2017 | Hutson | |
| 9,635,248 | B2 | | 4/2017 | Yang et al. | |
| 9,688,400 | B2 | | 6/2017 | Hutson | |
| 9,696,725 | B2 | | 7/2017 | Wang | |
| 9,733,644 | B2 | | 8/2017 | Levien et al. | |
| 9,760,072 | B2 | | 9/2017 | Hall et al. | |
| 9,815,552 | B1 | * | 11/2017 | Welsh | ..................... B64C 27/20 |
| 9,828,094 | B2 | | 11/2017 | McMillion | |
| 9,836,053 | B2 | | 12/2017 | Wang et al. | |
| 9,840,339 | B1 | | 12/2017 | OBrien et al. | |
| 9,842,505 | B2 | | 12/2017 | Wang et al. | |
| 9,856,016 | B2 | | 1/2018 | Mueller et al. | |
| 9,889,930 | B2 | | 2/2018 | Welsh et al. | |
| 9,902,493 | B2 | | 2/2018 | Simon et al. | |
| 9,908,632 | B1 | | 3/2018 | Kimchi et al. | |
| 9,914,538 | B2 | | 3/2018 | Yu | |
| 2002/0142699 | A1 | | 10/2002 | Davis | |
| 2003/0192989 | A1 | | 10/2003 | Owen et al. | |
| 2003/0212478 | A1 | | 11/2003 | Rios | |
| 2007/0262195 | A1 | * | 11/2007 | Bulaga | ..................... B64C 27/20 244/12.4 |
| 2008/0054121 | A1 | | 3/2008 | Yoeli | |
| 2010/0096493 | A1 | | 4/2010 | Khakimov et al. | |
| 2010/0140416 | A1 | * | 6/2010 | Ohanian, III | ........... B64C 21/04 244/23 A |
| 2011/0221692 | A1 | | 9/2011 | Seydoux et al. | |
| 2011/0226892 | A1 | | 9/2011 | Crowther et al. | |
| 2012/0158215 | A1 | | 6/2012 | Sun et al. | |
| 2012/0200703 | A1 | | 8/2012 | Nadir et al. | |
| 2012/0248259 | A1 | * | 10/2012 | Page | ....................... B64C 29/02 244/7 A |
| 2012/0267472 | A1 | * | 10/2012 | Pratzovnick | .......... B64C 39/024 244/13 |
| 2012/0271461 | A1 | | 10/2012 | Spata | |
| 2013/0134254 | A1 | | 5/2013 | Moore | |
| 2014/0025234 | A1 | | 1/2014 | Levien et al. | |
| 2014/0032034 | A1 | * | 1/2014 | Raptopoulos | ........ G08G 5/0069 701/25 |
| 2014/0037278 | A1 | | 2/2014 | Wang | |
| 2014/0061362 | A1 | | 3/2014 | Olm et al. | |
| 2014/0061376 | A1 | | 3/2014 | Fisher et al. | |
| 2014/0099853 | A1 | * | 4/2014 | Condon | ............... G05D 1/0033 446/37 |
| 2014/0158816 | A1 | * | 6/2014 | DeLorean | ........... B64C 29/0033 244/12.4 |
| 2014/0259628 | A1 | | 9/2014 | Hethcock et al. | |
| 2014/0374532 | A1 | | 12/2014 | Duffy et al. | |

(56) References Cited

U.S. PATENT DOCUMENTS

| | | |
|---|---|---|
| 2014/0376170 A1* | 12/2014 | Richard .................. G06F 1/203 361/679.32 |
| 2015/0160658 A1 | 6/2015 | Reedman et al. |
| 2015/0167492 A1 | 6/2015 | Collette et al. |
| 2015/0266570 A1 | 9/2015 | Metreveli |
| 2015/0274294 A1 | 10/2015 | Dahlstrom |
| 2016/0023755 A1* | 1/2016 | Elshafei .................. G08G 5/025 244/17.13 |
| 2016/0070265 A1 | 3/2016 | Liu et al. |
| 2016/0101856 A1 | 4/2016 | Kohstall |
| 2016/0122015 A1 | 5/2016 | Hutson |
| 2016/0122038 A1 | 5/2016 | Fleischman et al. |
| 2016/0144954 A1 | 5/2016 | Daigle |
| 2016/0152327 A1* | 6/2016 | Bertels .................. B64C 11/001 417/423.7 |
| 2016/0176520 A1 | 6/2016 | Goldstein |
| 2016/0200415 A1 | 7/2016 | Cooper |
| 2016/0207368 A1 | 7/2016 | Gaonjur |
| 2016/0221671 A1 | 8/2016 | Fisher et al. |
| 2016/0221683 A1 | 8/2016 | Roberts et al. |
| 2016/0229530 A1 | 8/2016 | Welsh et al. |
| 2016/0229534 A1* | 8/2016 | Hutson .................. B64C 27/08 |
| 2016/0280369 A1* | 9/2016 | Pounds .................. A63H 27/00 |
| 2016/0286128 A1 | 9/2016 | Zhou |
| 2016/0340035 A1 | 11/2016 | Duru |
| 2016/0378108 A1* | 12/2016 | Paczan .................. B64C 37/02 705/330 |
| 2017/0011333 A1 | 1/2017 | Greiner et al. |
| 2017/0057630 A1 | 3/2017 | Schwaiger |
| 2017/0057650 A1* | 3/2017 | Walter-Robinson .......................... B64D 41/00 |
| 2017/0073070 A1 | 3/2017 | Xing |
| 2017/0144757 A1 | 5/2017 | Hall et al. |
| 2017/0152060 A1 | 6/2017 | Morisawa |
| 2017/0217585 A1 | 8/2017 | Hulsman et al. |
| 2017/0225783 A1 | 8/2017 | Fisher et al. |
| 2017/0291697 A1 | 10/2017 | Kornatowski et al. |
| 2017/0297707 A1 | 10/2017 | Rollefstad et al. |
| 2017/0313418 A1 | 11/2017 | Yoon |
| 2017/0322563 A1 | 11/2017 | Kohstall |
| 2017/0359106 A1 | 12/2017 | John Wilson et al. |
| 2018/0099745 A1 | 4/2018 | Welsh et al. |
| 2018/0141672 A1* | 5/2018 | Bevirt .................. B64D 27/24 |
| 2018/0155018 A1* | 6/2018 | Kovac .................. B64C 29/0016 |
| 2018/0194463 A1* | 7/2018 | Hasinski .................. B64C 39/024 |

FOREIGN PATENT DOCUMENTS

| | | |
|---|---|---|
| CN | 102273083 | 12/2011 |
| CN | 104253887 | 12/2014 |
| CN | 204406209 | 3/2015 |
| CN | 104486543 | 4/2015 |
| CN | 104679013 | 6/2015 |
| CN | 104685436 | 6/2015 |
| CN | 104991561 | 10/2015 |
| CN | 105035318 A | 11/2015 |
| CN | 105116909 | 12/2015 |
| CN | 105182986 | 12/2015 |
| CN | 204822682 U | 12/2015 |
| CN | 105425952 | 3/2016 |
| CN | 105836120 A | 8/2016 |
| CN | 106335635 A | 1/2017 |
| EP | 1901153 | 3/2008 |
| EP | 2731271 | 5/2014 |
| WO | 112578 | 10/2006 |
| WO | 054937 | 4/2009 |
| WO | 2014003698 A1 | 1/2014 |
| WO | 080598 | 5/2016 |
| WO | 2016112124 A2 | 7/2016 |

* cited by examiner

AERIAL SYSTEM THERMAL CONTROL SYSTEM AND METHOD

CROSS-REFERENCE TO RELATED APPLICATIONS

This application is a continuation-in-part of U.S. application Ser. No. 15/349,749, filed on 11 Nov. 2016, which claims the benefit of U.S. Provisional Application No. 62/353,337, filed 22 Jun. 2016, and U.S. Provisional Application No. 62/326,600, filed 22 Apr. 2016, and is a continuation-in-part of International Applications: PCT/CN2015/099339 filed 29 Dec. 2015, which claims the priority of U.S. Patent Application No. 62/099,512 filed 4 Jan. 2015 and Chinese Patent Application No. 201510547151.3 filed 31 Aug. 2015; PCT/CN2016/070579 filed 11 Jan. 2016, currently pending, which claims the priority of Chinese Patent Application No. 201510487415.0 filed 10 Aug. 2015, PCT/CN2016/070583 filed 11 Jan. 2016, currently pending, which claims the priority of Chinese Patent Application No. 201510487744.5 filed 10 Aug. 2015, and PCT/CN2016/070581 filed 11 Jan. 2016, currently pending, which claims the priority of Chinese Patent Application No. 201510487412.7 filed 10 Aug. 2015, all of which are incorporated in their entireties by this reference.

This application claims the benefit of U.S. Provisional Application Ser. No. 62/326,792, filed on 24 Apr. 2016, and U.S. Provisional Application Ser. No. 62/353,344, filed on 22 Jun. 2016, both of which are incorporated in their entirety by this reference.

TECHNICAL FIELD

This invention relates generally to the aerial system field, and more specifically to a new and useful cooling system and method in the aerial system field.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview

Figure 1:
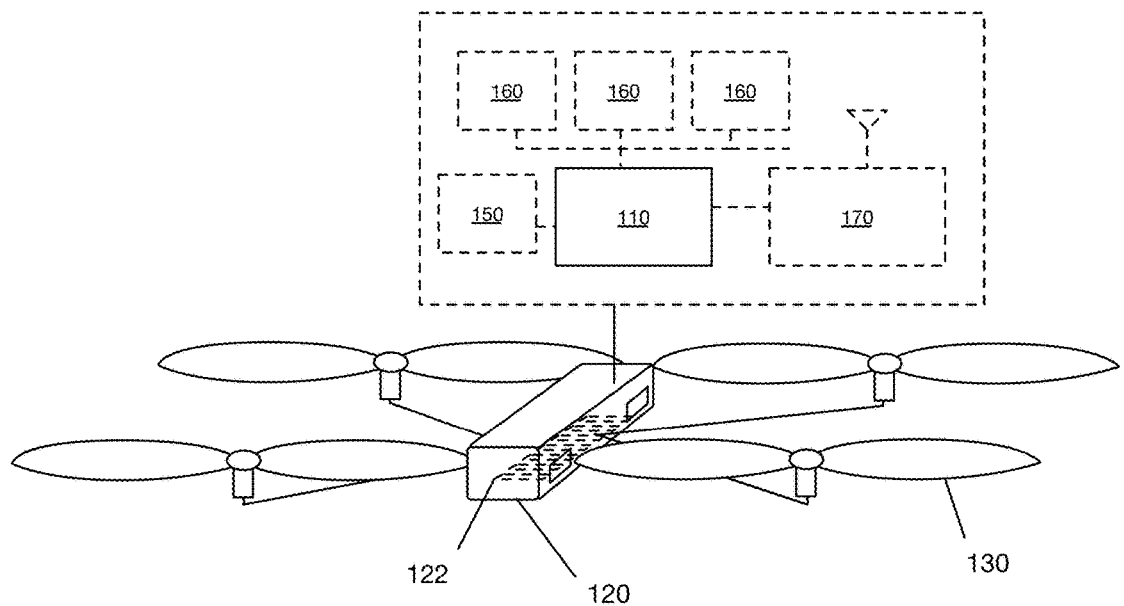
FIG. 1 is a schematic representation of a variation of the aerial system.

As shown in FIG. 1, the aerial system 100 can include a processing system 110, a housing 120, and a lift mechanism 130. The aerial system can optionally include a power supply 150, sensors 160, a communication system 170, and/or include any other suitable component. The aerial system functions to fly within a physical volume. The aerial system can additionally function to cool the processing system 110 with the lift mechanism 130. In one example, the aerial system includes a housing 120 with a plurality of cooling channels 122 and rotors that are arranged proximal the processing system 110, such that the airflow, generated by rotor rotation during flight, flows through the cooling channels 122 to cool the processing system 110 housed within the housing 120.

2. Benefits

This aerial system configuration can confer several benefits over conventional systems.

First, by cooling the processing system 110 with the airflow from the lift mechanism 130, the aerial system can reduce the number and/or size of additional cooling elements (e.g., fans) required for processing system operation, potentially even eliminating the need for additional cooling elements. Because additional cooling elements require physical volume on the aerial system, add weight to the system, and consume power for operation, this configuration can confer the additional benefits of reducing the aerial system size, which can be preferred for consumer applications, reducing the aerial system weight, which can minimize power consumption, and reducing power consumption during operation, which can confer longer operation times.

Second, because airflow from the lift mechanism 130 can be greater than that provided by conventional cooling elements (e.g., due to the larger motors, larger propellers, etc.), this aerial system configuration can provide increased processing system cooling over conventional systems. This increased cooling can enable use of processing systems with greater processing power in the aerial system and/or enable the more of the processing systems' processing power to be used (e.g., allow the processors 111 to be overclocked). Using processing systems with increased processing power can enable resource-intensive processes (e.g., computationally-intensive processes), such as image processing (e.g., object recognition, image stabilization, object tracking, etc.) or automatic flight control, to be performed on-board the aerial system. Performing these processes on-board the aerial system can enable the aerial system to react faster to process outputs, to minimize latency effects on data processing (e.g., when multiple unsynchronized data streams from different sensors are used for data processing), to offload processing tasks from other devices, or enable any other suitable benefit. Additionally or alternatively, the increased processing power can enable these processes to be performed faster than conventional systems.

However, the aerial system can confer any other suitable set of benefits.

3. System

The aerial system can include a processing system 110, a housing 120, and a lift mechanism 130. The aerial system can optionally include a power supply 150, sensors 160, a communication system 170, and/or include any other suitable component. The aerial system functions to fly within a physical volume. The aerial system (e.g., aerial vehicle) is preferably a rotorcraft (e.g., quadcopter, helicopter, cyclocopter, tricopter, hexacopter, octacopter, etc.), but can alternatively be a fixed-wing aircraft, aerostat, or be any other suitable aerial system.

The processing system no of the aerial system functions to control aerial system operation. The processing system no can process images recorded by the on-board cameras (e.g., automatically stabilize the image, automatically stabilize the camera, recognize objects within the image, generate 3D models of the adjacent physical space, mosaic images together, etc.), automatically plan navigation paths based on the sensed information, automatically control aerial system component operation (e.g., selectively adjust lift mechanism operation, etc.); receive, interpret, and operate the aerial system components based on remote control instructions; or otherwise control aerial system operation. The aerial system can include one or more processing systems, wherein different processors 111 can perform the same functionality (e.g., function as a multi-core system), or be specialized. The processing system 110 can include one or more: processors (e.g., CPU, GPU, microprocessor, etc.), memory (e.g., Flash, RAM, etc.), or any other suitable component. The processing system 110 is preferably powered by the power supply 150, but can be otherwise powered. The processing system 110 is preferably connected to and controls the sensors 160, communication system 170, and lift mechanism 130, but can additionally or alternatively be connected to and interact with any other suitable component.

The processing system 110 is preferably mounted to the housing 120, but can alternatively be mounted to any other suitable component. The processing system 110 is preferably mounted to the housing interior (e.g., be substantially surrounded or encompassed by the housing 120), but can alternatively be mounted to the housing exterior. The processing system 110 is preferably mounted to a housing broad face (e.g., parallel a main housing plane encompassing the housing longitudinal and lateral axes), but can alternatively be mounted to a housing side or any other suitable surface. The processing system 110 can be mounted to the bottom broad face, the top broad face, be mounted along the housing thickness (e.g., be mounted along the processor edges to the housing sides, be mounted along the second broad face to a board mounted to the housing sides, etc.), be mounted to the top surface of the housing interior, or be mounted to any other suitable housing surface. The processing system 110 can be mounted to the housing 120: directly (e.g., by clips, screws, grooves, etc.), by an intermediary (e.g., a board, a suspension system, etc.), or otherwise mounted to the housing 120. The processing system 110 can be mounted proximal, more preferably adjacent, the cooling channels 122 of the housing 120, but can alternatively be mounted distal the cooling channels 122 or in any other suitable location. The processing system 110 is preferably arranged within the cooling fluid path defined by the cooling channels 122 (e.g., arranged in series with the cooling fluid path), but can alternatively be arranged parallel the cooling fluid path or be otherwise arranged relative to the cooling fluid path(s).

The processing system 110 (and/or any other components that may be actively cooled during performance of the method, such as described below) is preferably arranged away from the inlets and outlets of the lift mechanisms 130 (e.g., to avoid interference with and/or reduction of propulsion generated by the lift mechanisms 130, such as by blocking or redirecting fluid forced through a rotor). For example, the processing system no can be arranged such that, for each rotor of the aerial system, a projection of the processor 111 onto the respective rotor plane 133 does not intersect the respective swept area 134 of that rotor, can be arranged such that a lateral plane of the aerial vehicle intersects the processing system components (e.g., processor 111) and each rotor of the aerial system (e.g., wherein the swept areas 134 of the rotors can be substantially coplanar or angled), can be arranged within a convex hull of the substantially parallel rotor axes 132 of the aerial system rotors (e.g., the four rotors of a quadcopter aerial system), and/or have any other suitable arrangement away from the lift mechanism inlets and outlets. However, the processing system 110 can alternatively be arranged near one or more lift mechanism inlets and/or outlets (e.g., arranged directly above or below a rotor), and/or have any other suitable arrangement with respect to the lift mechanisms 130 and/or other aerial system components.

The processing system 110 can additionally include a heat exchanger 112 that functions to transfer heat generated by the processing system components to the cooling fluid (e.g., air, blown by the rotors). The heat exchanger 112 (e.g., heatsink) is preferably passive (e.g., be a thermally conductive block with cooling features, include phase change material, etc.), but can alternatively be active (e.g., include a peltier device). The heat exchanger 112 can be made of metal (e.g., copper, aluminum, gold, etc.), plastics, or any other suitable thermally conductive material. The heat exchanger 112 can include a component coupling surface (e.g., a substantially flat surface) and a set of cooling features extending from a heat exchanger face opposing and/or adjacent the component coupling surface. The component coupling surface of the heat exchanger can thermally and mechanically connect to the processing system component, wherein the thermal connection can be augmented or established by thermal adhesive, thermal grease, a mechanical coupling (snapped, screwed, clipped, epoxied), or otherwise achieved. The cooling features can include fins (e.g., straight, flared, etc.), pins, cavities, or any other suitable cooling feature. The heat exchanger 112 can be thermally connected to the processor 111, or to any other suitable component of the processing system 110. When the aerial system includes multiple processing systems, the aerial system can include a single heat exchanger spanning all processors, include different heat exchangers for different processing systems, include heat exchangers for a subset of the processors, or have any other suitable configuration. The heat exchanger 112 is preferably coupled to the outward-facing broad face of the processing system component, such that the heat exchanger 112 is upstream of the processing system component within the cooling fluid path, but can alternatively be coupled to any other suitable face of the processing system component.

In a specific example, the aerial system includes a processor 111 defining a first and second broad face and a heatsink coupled to the first broad face. The processor 111 is mounted within the housing interior (e.g., to a board, supporting the remainder of the processing system components, that is mounted to the housing sides), with the heatsink proximal a bottom surface of the housing 120 and the processor distal the bottom surface. In second specific example, the aerial system includes a first and second processor 111. The first processor 111 includes a heatsink connected along a first broad face, and the second processor 111 can lack a heatsink. The first and second processors are mounted along a bottom and top broad face of a shared board (e.g., printed circuit board), respectively, wherein the board mounts the processors 111 to the housing 120. The first board can be mounted with the heatsink distal the board and proximal the housing bottom surface, but can be otherwise arranged. However, the processor 111 can be otherwise arranged within the aerial system.

The processing system 110 can additionally include one or more temperature sensors that function to monitor a processing system temperature (e.g., processor temperature, chip temperature, board temperature, etc.) and/or active component temperature. The processing system 110 can include one temperature sensor for each processor 111, multiple temperature sensors for multiple processors, one temperature sensor for multiple processors, multiple temperature sensors for multiple processors (e.g., wherein the temperature of a single processor can be triangulated from measurements from multiple temperature sensors), or any other suitable combination. The temperature sensor can be a thermistor, thermocouple, resistance thermometer, silicon bandgap temperature sensor, integrated circuit temperature sensor, transducer, switch, or any other suitable temperature sensor. The temperature sensor is preferably thermally coupled (e.g., by a thermal interface, such as air, metal, thermal grease, etc.), more preferably thermally connected (e.g., directly connected to), to the heat-generating component (e.g., processing system 110, communications module, power supply 150, etc.), but can alternatively be otherwise coupled to the heat-generating component. The temperature sensor is preferably mechanically coupled, more preferably mechanically connected, to the active component (e.g., mounted to a common board, clipped, integrated into the chipset, etc.), but can alternatively be otherwise coupled to the heat-generating component. In one variation of system operation, the processing system 110 can monitor the heat-generating component temperature and dynamically adjust the rotor speed (e.g., linearly, nonlinearly, quadratically, exponentially, logarithmically, etc.) in response to determination of a difference between the measured temperature and a target temperature. However, the temperature sensor can be otherwise used.

The aerial system can additionally include a power supply 150, which functions to power the active components of the aerial system (e.g., lift mechanism's motors, power supply 150, etc.). The power supply 150 can be mounted to the housing 120 and connected to the active components, or be otherwise arranged. The power supply 150 can be a rechargeable battery, secondary battery, primary battery, fuel cell, or be any other suitable power supply. The power supply 150 can be part of the processing system 110, separate from the processing system 110, or otherwise related to the processing system 110. The power supply 150 can be cooled using the flow from the rotors or otherwise cooled.

The aerial system can additionally include sensors 160, which function to acquire signals indicative of the aerial system's ambient environment and/or aerial system operation. The sensors 160 are preferably mounted to the housing 120, but can alternatively be mounted to any other suitable component. The sensors 160 are preferably powered by the power supply 150 and controlled by the processor 111, but can be connected to and interact with any other suitable component. The sensors 160 can include one or more: cameras (e.g., CCD, CMOS, multispectral, visual range, hyperspectral, stereoscopic, IR, etc.), orientation sensors (e.g., accelerometer, gyroscope, altimeter), audio sensors (e.g., transducer, microphone, etc.), light sensors, temperature sensors, current sensor (e.g., Hall effect sensor), magnetometer, air flow meter, voltmeters, touch sensors (e.g., resistive, capacitive, etc.), proximity sensors, force sensors (e.g., strain gauge meter, load cell), vibration sensors, chemical sensors, location sensor (e.g., GPS, GNSS, triangulation, etc.), or any other suitable sensor. In one variation, the aerial system includes a first camera mounted (e.g., statically or rotatably) along a first end of the aerial system housing 120 with a field of view intersecting the lateral plane of the housing 120; a second camera mounted along the bottom of the aerial system housing 120 with a field of view substantially parallel the lateral plane; and a set of orientation sensors, such as an altimeter and accelerometer. The sensors 160 can be part of the processing system 110, separate from the processing system 110, or otherwise related to the processing system 110. The sensors 160 can be cooled using the flow from the rotors or otherwise cooled. However, the system can include any suitable number of any sensor type.

The aerial system can additionally include a communication system 170, which functions to communicate with one or more remote computing systems. The communication module can be a long-range communication module, a short-range communication module, or any other suitable communication module. The communication module can facilitate wired and/or wireless communication. Examples of the communication module include a 802.11x, Wi-Fi, Wi-Max, NFC, RFID, Bluetooth, Bluetooth Low Energy, ZigBee, cellular telecommunications (e.g., 2G, 3G, 4G, LTE, etc.), radio (RF), wired connection (e.g., USB), or any other suitable communication module or combination thereof. The communication system 170 is preferably powered by the power supply 150, but can be otherwise powered. The communication system 170 is preferably connected to the processing system 110, but can additionally or alternatively be connected to and interact with any other suitable component. The communication system 170 can be part of the processing system 110, separate from the processing system 110, or otherwise related to the processing system 110. The communication system 170 can be cooled using the flow from the rotors or otherwise cooled.

The aerial system can additionally include inputs (e.g., microphones, cameras, etc.), outputs (e.g., displays, speakers, light emitting elements, etc.), or any other suitable component.

The housing 120 of the aerial system can function to support and/or protect the aerial system components. The housing 120 preferably substantially encapsulates the communication system 170, power supply 150, and processing system 110, but can be otherwise configured. The housing 120 can include a platform, an enclosure, or have any other suitable configuration. The housing 120 is preferably thermally conductive (e.g., functions as an auxiliary heatsink).

The housing 120 can be made of carbon fiber, carbon composite, metal, plastic, ceramic, or any other suitable material.

The housing 120 can additionally or alternatively define a set of cooling channels 122 that function to route cooling fluid into the housing lumen, within the housing lumen, and/or out of the housing lumen. This can function to cool heat-generating components housed within the housing lumen, such as the processing system 110, communication system 170, power supply 150, sensors 160, or other components. In some variations, one or more of the cooling channels 122 can double as ports for external wired connectors (e.g., USB port, etc.). The cooling fluid is preferably ambient air, more preferably ambient air used to generate thrust by the lift mechanism 130, but can alternatively be liquid (e.g., water, coolant, etc.), phase change material (e.g., gas to liquid, solid to liquid, solid to gas, etc.), or be any other suitable cooling fluid.

Figure 4A:
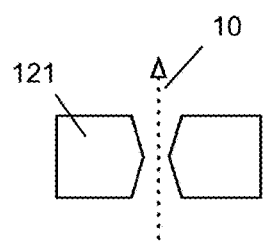
FIGS. 4A-4C are longitudinal cross-sectional views of a first, second, and third cooling channel embodiment, respectively.
Figure 4B:
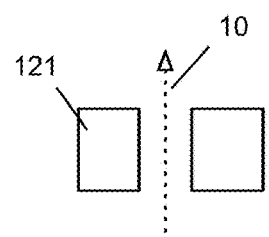
Figure 4C:
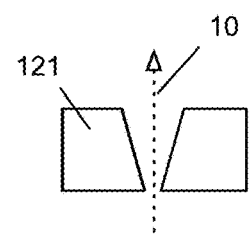
Figure 5A:
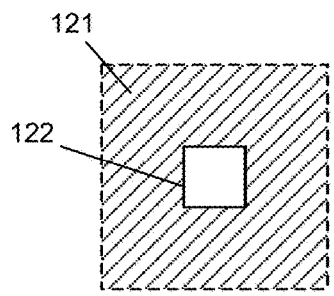
FIGS. 5A and 5B are cross-sectional views of a fourth and fifth cooling channel embodiment, respectively.
Figure 5B:
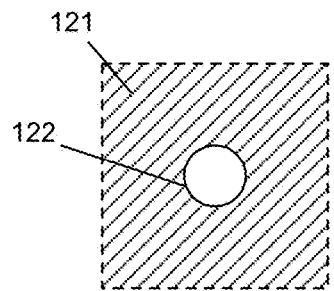

Each cooling channel 122 can include a body extending between an inlet and an outlet. The cooling channels 122 are preferably made of the same material as the housing 120, but can alternatively be made of a different material. The cooling channels 122 can be defined by the housing 120, be an insert inserted into the housing 120, or be otherwise constructed. In a first variation, the cooling channels 122 can be through-holes defined through the housing thickness. In a second variation, the cooling channels 122 can be manifolds (e.g., tubes) extending within the housing lumen. In a third variation, the cooling channels 122 can be manifolds (e.g., tubes) that extend through the housing thickness and fluidly connect the housing lumen to the housing exterior. The cooling channel cross section (e.g., perpendicular the flow axis) can be circular (example shown in FIG. 5B), ovoid, a circular segment, annular, ellipsoid, polygonal (e.g., rectangular, triangular, octagonal, quadrilateral, pentagonal, star, etc.), boustrophedonic, sinusoidal, or have any other suitable cross section. The cooling channel cross section can be constant along the cooling channel length (example shown in FIG. 4B), variable along the cooling channel length (e.g., taper toward the outlet; taper toward the inlet, such as shown in FIG. 4C; include a neck between the inlet and outlet, such as shown in FIG. 4A; include a widened region between the inlet and outlet, etc.), or have any other suitable configuration. The longitudinal axis of the cooling channel body can be perpendicular, parallel, or at any suitable angle to the central broad plane of the housing 120 or frame 123; perpendicular, parallel, or at any suitable angle to a rotor rotational plane; or be arranged at any other suitable angle. However, the cooling channels 122 can have any other suitable construction.

In a first variation, the cooling channel 122 is fluidly connected to the ambient environment at the inlet and fluidly connected to the housing lumen at the outlet. In this variation, heated cooling fluid within the housing lumen can be egressed from the housing lumen through a second cooling channel 122, or otherwise egressed. In a second variation, the cooling channel 122 is fluidly connected to a cooling fluid source (e.g., a pump or reservoir) at the inlet and outlet, wherein the body can be thermally connected and/or fluidly connected to the processor 111 and/or heat exchanger 112 (e.g., interior or exterior). However, the cooling channel 122 can be otherwise configured.

The cooling channels 122 can be arranged along the bottom surface of the housing, top surface of the housing, one or more sides of the housing, or any other suitable surface of the housing. In a first variation, the housing 120 includes a first set of inlet cooling channels 122 along the bottom of the housing, and a second set of outlet cooling channels 122 along the longitudinal sides of the housing. In this variation, the cooling channels 122 can be through-holes defined through the thickness of the housing. In a second variation, the housing 120 includes a set of cooling channels 122 arranged with a length of the cooling channel body extending along the bottom of the housing. In this variation, the cooling channels 122 can include tubing or fluid manifolds. However, the cooling channels 122 can be otherwise arranged.

The cooling channels 122 (and/or any other suitable airflow elements, such as those configured to route cooling fluid toward and/or away from the components to be actively cooled) are preferably arranged away from the inlets and outlets of the lift mechanisms 130 (e.g., to avoid interference with and/or reduction of propulsion generated by the lift mechanisms 130, such as by blocking or redirecting fluid forced through a rotor). For example, the cooling channels 122 can be arranged such that, for each rotor of the aerial system, a projection of the cooling channels 122 onto the respective rotor plane 133 does not intersect the respective swept area 134 of that rotor, can be arranged within a convex hull of the substantially parallel rotor axes 132 of the aerial system rotors (e.g., the four rotors of a quadcopter aerial system), and/or have any other suitable arrangement away from the lift mechanism inlets and outlets. However, the processing system 110 can alternatively be arranged near one or more lift mechanism inlets and/or outlets (e.g., arranged directly above or below a rotor), and/or have any other suitable arrangement with respect to the lift mechanisms 130 and/or other aerial system components.

Each cooling channel 122 can additionally include and/or define cooling features that function to increase the heat exchange surface of the cooling channel 122 (e.g., pins, grooves, fins, etc.), fluid flow features that function to shape and/or adjust the fluid flow characteristics within the housing lumen, or include any other suitable set of features. In one variation, the cooling channels 122 include features that generate turbulent flow within the channel body and/or housing lumen. In a second variation, the cooling channels 122 include features that generate laminar flow within the channel body and/or housing lumen. However, any other suitable set of features can be included. These features can be arranged along the cooling channel walls (e.g., along the cooling channel lumen), within the cooling channel lumen (e.g., within the cooling fluid path), or be arranged in any other suitable position.

Figure 6A:
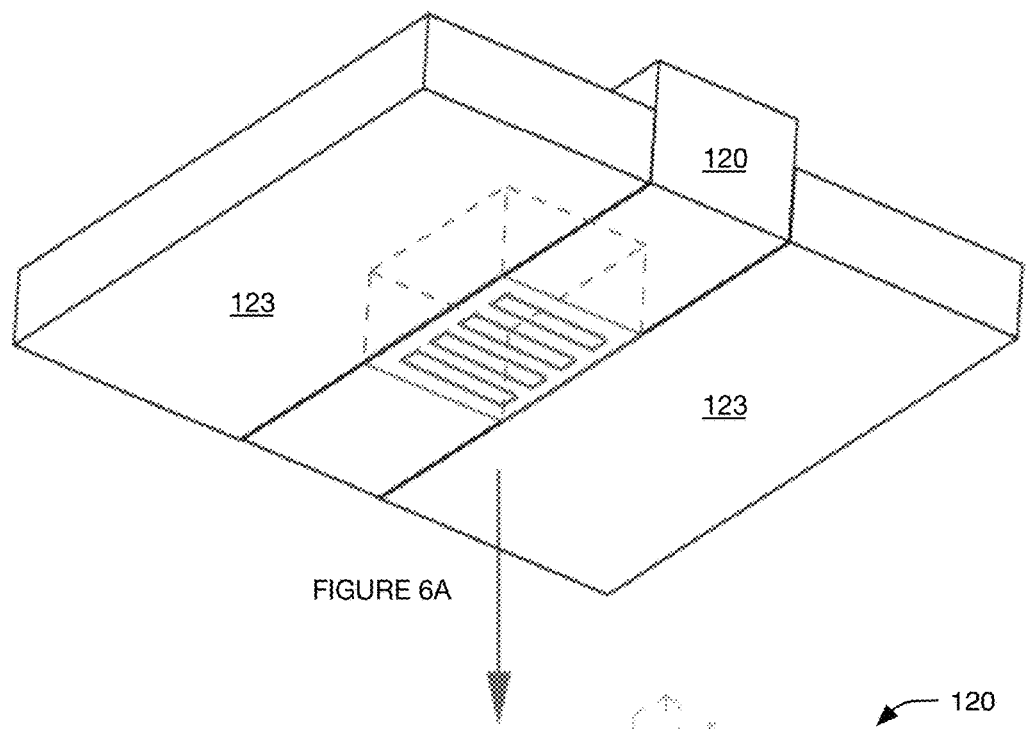
FIGS. 6A and 6B are a perspective view of a specific example of the housing and a perspective cutaway view of a portion of the specific example.
Figure 6B:
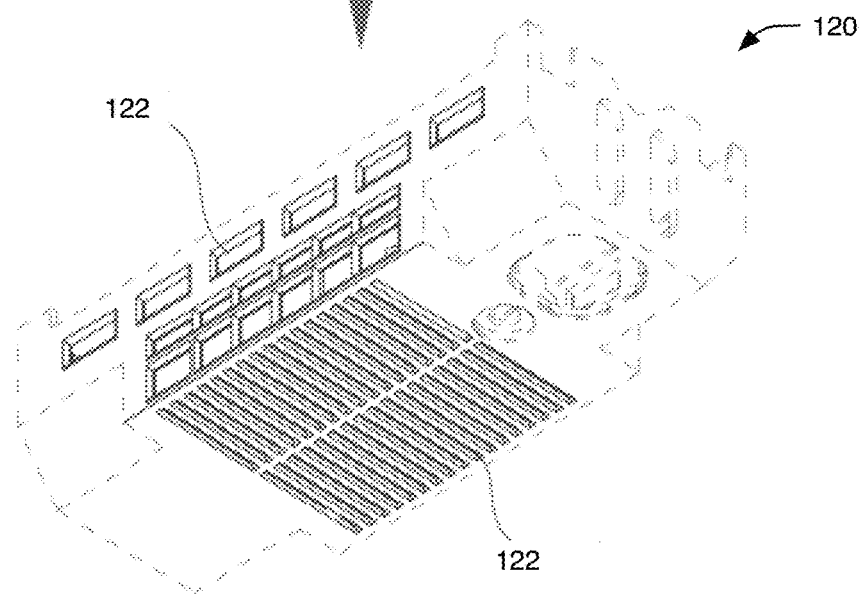

The housing 120 can include one or more cooling channels of same or differing type. Multiple cooling channels are preferably separately defined on the housing 120, but can alternatively share inlets, outlets, bodies, features, or any other suitable component. The cooling channels can be arranged in parallel, in an array (example shown in FIGS. 6A-6B), in a matrix, arranged offset from adjacent channels, or be otherwise arranged relative to the remainder of the cooling channels. In one variation, the cooling channels are arranged such that they cooperatively generate turbulent flow within the housing lumen. In a second variation, the cooling channels are arranged such that they cooperatively generate laminar flow within the housing lumen. In one example, a plurality of cooling channels (e.g., functioning as inlets) are arranged in an array, wherein adjacent cooling channels of the plurality are separated by housing material having a width less than or substantially equal to a cooling channel dimension (e.g., length, width, thickness, etc.). However, the cooling channels can be otherwise arranged.

The set of cooling channels can cooperatively define one or more cooling fluid paths. In one variation, each cooling channel 122 defines a fluid path. In a second variation, multiple cooling channels (e.g., a first and second cooling channel 122) cooperatively define a cooling fluid path. However, the cooling fluid paths can be otherwise defined.

The cooling fluid path can be coextensive with a cooling channel body, extend beyond a cooling channel body, extend along a portion of a cooling channel length, or be otherwise related to the cooling channel 122. The cooling fluid path (e.g., cooling channel lumen) can be fluidly connected to the ambient environment at the inlet and/or outlet, fluidly isolated from the ambient environment, or otherwise related to the ambient environment. The cooling fluid paths are preferably thermally connected to the ambient environment, but can be thermally isolated from the ambient environment or otherwise coupled to the ambient environment. The cooling fluid paths are preferably thermally connected to the heat-generating component (e.g., heat-generating component body, heat sink, etc.), but can be thermally isolated from the ambient environment or otherwise coupled to the ambient environment.

Figure 7:
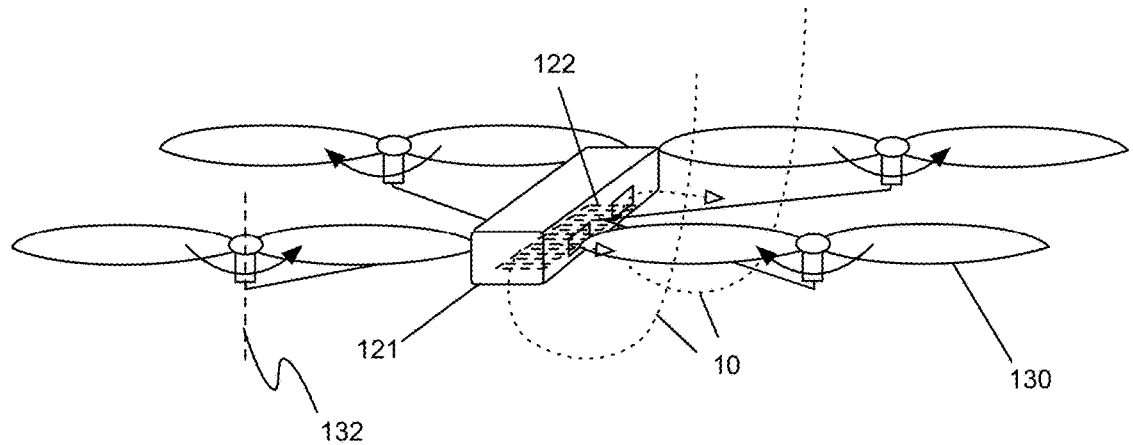
FIG. 7 is a perspective representation of a variation of cooling fluid flow through the aerial system.
Figure 8:
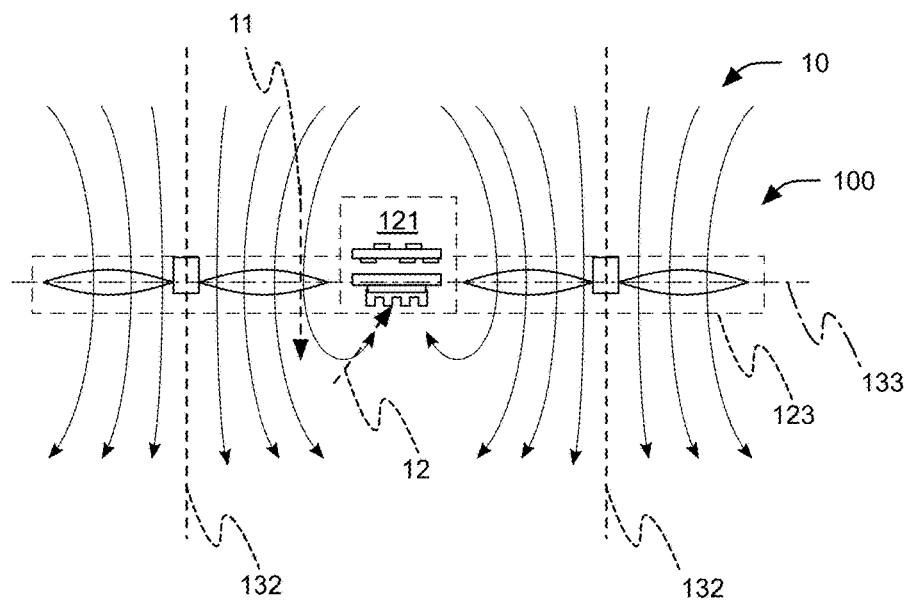
FIG. 8 is a cutaway representation of a variation of cooling fluid flow through the aerial system.
Figure 9:
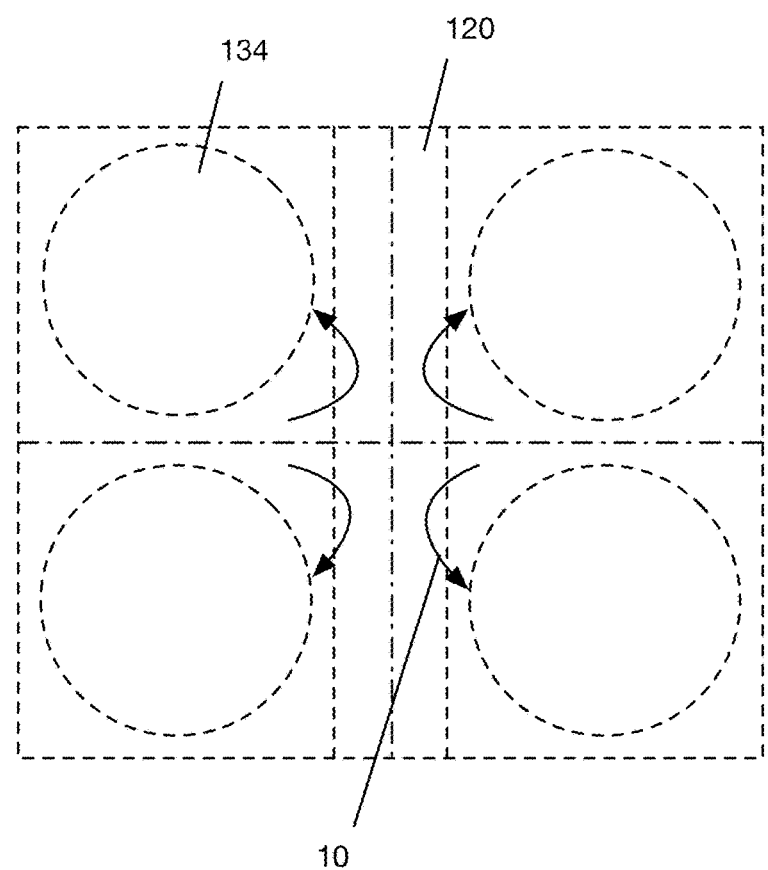
FIG. 9 is a top down representation of a variation of cooling fluid flow through the aerial system.

In a first variation, the cooling fluid path extends from the ambient environment, through a first cooling channel 122 in the first broad housing surface (e.g., top surface, bottom surface), into the housing lumen, past the heat-generating component (e.g., the heat exchanger 112 of the processing system no), and out to the ambient environment through a second cooling channel 122 in the housing side or second broad housing surface (e.g., opposing the first broad housing surface or the same broad housing surface), examples shown in FIGS. 7 and 8. In a second variation, the cooling fluid path extends from the ambient environment, through a first cooling channel 122 in the housing side, into the housing lumen, past the heat-generating component (e.g., the heat exchanger 112), and out to the ambient environment through a second cooling channel 122 in the housing side (e.g., same housing side, opposing housing side, etc.) or broad housing surface (example shown in FIG. 9). In a third variation, the cooling fluid path extends from a cooling fluid source (e.g., reservoir), to the heat-generating component, and back to the cooling fluid source. The cooling fluid path can additionally pass along a housing broad face (e.g., top, bottom) before and/or after passing by the heat-generating component. However, the cooling fluid path can be otherwise configured.

Figure 2:
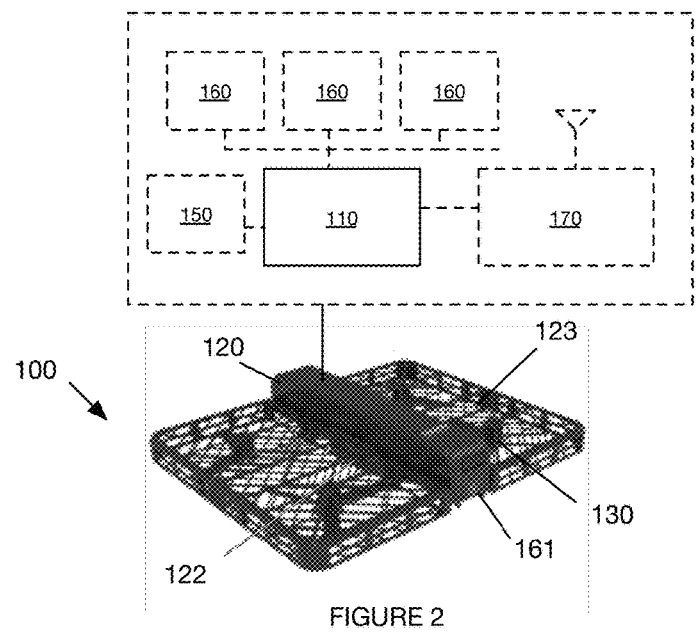
FIG. 2 is a schematic representation of an example of the aerial system.

As shown in FIG. 2, the housing 120 can additionally include one or more frames 123 (e.g., cage) that extend along a portion of the rotors (e.g., form one or more rotor housings). The frame 123 can function as an intermediary component between a user's hand and the rotor (e.g., function to partially or entirely encapsulate the rotor), and can optionally function to redirect airflow toward the cooling channels within the housing 120, as a mounting point for the rotors and/or motors, or to perform any other suitable functionality. The frame 123 preferably extends parallel the rotor rotational plane, but can alternatively extend in any suitable direction. The housing 120 preferably includes a first and second frame 123 for a first pair and second pair of rotors, respectively, but can alternatively include a frame 123 for each rotor or include any suitable number of frames associated with any suitable number of rotors. The frame 123 can extend along a single side of the housing (e.g., along the bottom of the rotors, along the top of the rotors), along a first and second side of the housing (e.g., along the top and bottom of the rotors), encapsulate the rotors (e.g., extend along all sides of the rotors), or be otherwise configured.

The frame 123 can include a first broad surface, a second broad surface opposing the first broad surface, and/or a set of sides connecting the first and second broad surfaces. The frame thickness (e.g., height) can be less than, equal to, or thicker than the thickness of the main housing 120. The frame broad surfaces and/or sides can be solid, include fluid flow apertures 124 (e.g., fluid flow channels having configurations similar to or different from that disclosed for the cooling channels 122 above, etc.) that enable airflow between the ambient environment and the rotors and/or redirect all or some of the airflow toward the main housing 120, or include any other suitable set of features. When the frame 123 includes a first and second broad surface, the second broad surface can be a substantially identical copy, a mirror image, entirely different, or otherwise related to the first broad surface.

The fluid flow apertures 124 (e.g., airflow apertures) of the frame 123 preferably fluidly connect one or more of the rotors to an ambient environment, which can function to enable the flow of air and/or other suitable fluids between the ambient environment and the rotors (e.g., enabling the rotors to generate an aerodynamic force that causes the aerial system to move throughout the ambient environment). The apertures can be elongated, or can have comparable length and width. The apertures can be substantially identical, or can differ from each other. The apertures are preferably small enough to prevent components of an external retention mechanism (e.g., fingers of a hand) from passing through the apertures. The geometrical transparency (e.g., ratio of open area to total area) of the frame 123 near the rotors is preferably large enough to enable aerial system flight, more preferably enabling high-performance flight maneuvering. For example, each aperture can be smaller than a threshold size (e.g., smaller than the threshold size in all dimensions, elongated slots narrower than but significantly longer than the threshold size, etc.). In a specific example, the frame 123 has a geometrical transparency of 80-90%, and the apertures (e.g., circles, polygons such as regular hexagons, etc.) each of define a circumscribed circle with a diameter of 12-16 mm. However, the body can be otherwise configured.

The frame 123 can be statically mounted, actuatably mounted, removably mounted, or otherwise mounted to the main housing 120. The frame 123 can be mounted with the central broad plane of the frame substantially coplanar with the central broad plane of the main housing, mounted with the bottom broad surface of the frame substantially coplanar with the bottom broad surface of the main housing (e.g., in an unfolded position), mounted with the top broad surface of the frame substantially coplanar with the top broad surface of the main housing, or mounted to the housing in any other suitable configuration.

The frame 123 can additionally include one or more mounting points that function to mount the lift mechanism motor and/or functions as a rotational bearing surface for the rotors. The mounting point is preferably static, but can be actuatable (e.g., rotate about the rotor rotational axis, rotate along an axis perpendicular the rotor rotational axis, etc.). In one variation, the processing system 110 can dynamically control the mounting point angular position to selectively redirect airflow toward and/or away from the main housing 120 or heat-generating component. However, the mounting point can be otherwise configured and/or controlled.

The mounting point is preferably arranged along the frame interior, but can alternately be arranged along the frame exterior. The mounting point can be arranged along the top surface of the frame, along the bottom surface of the frame, along the frame side or along any suitable surface of the frame 123. The mounting point is preferably arranged above the rotor (e.g., relative to a gravity vector, typical system orientation, etc.) and/or before the rotor along a propulsion airflow vector (e.g., wherein air flows past the mounting point, through the rotor swept area 134, and then out through the frame 123), such as shown in FIG. 3, but can additionally or alternatively be arranged below the rotor, past the rotor along the propulsion airflow vector, and/or in any other suitable position.

Figure 3:
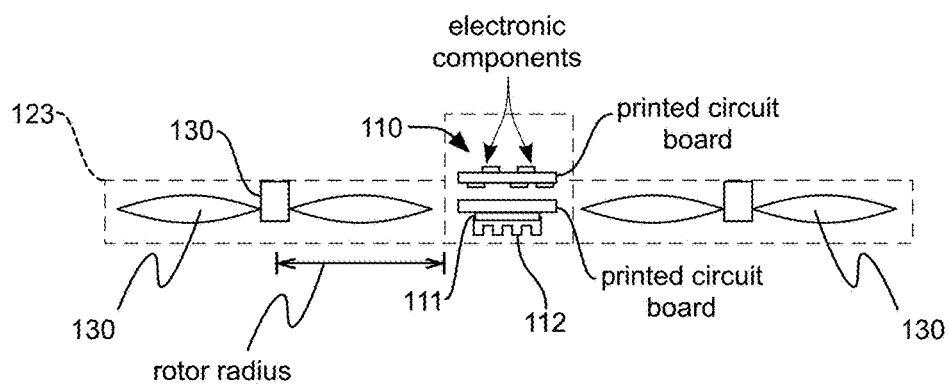
FIG. 3 is a cutaway view of a specific example of the aerial system.

As shown in FIG. 3, the distance between the main housing 120 (e.g., frame-main housing junction; a cooling channel 122, such as the closest cooling channel, farthest cooling channel, mean- or median-distance cooling channel, etc.; an element within the main housing 120, such as the processor 111, heat exchanger 112, power supply 150, etc.) and the mounting point is preferably substantially equal to the length (e.g., apparent length, absolute length, etc.) of the rotor blade (e.g., propeller blade), but can alternatively be longer or shorter. This spacing can function to minimize the distance (e.g., lateral distance) from the swept area of the rotor (and/or rotor tip) to the cooling channels and/or elements to be cooled. The distance between the main housing 120 and the mounting point can be determined from the central axis of the mounting point (e.g., coaxial with the rotor rotational axis, offset from the rotor rotational axis, etc.), from the mounting point edge, or from another reference point on the mounting point. The distance between the main housing 120 and the mounting point (e.g., projected to a plane parallel the rotor rotational plane) can be 150% of the propeller blade length (e.g., rotor radius, such as a distance from the rotor axis to the propeller blade tip farthest from the axis) or less (e.g., corresponding to 75% or less of the rotor diameter, such as a diameter defined by the swept area), 145% of the propeller blade length or less, 140% of the propeller blade length or less, 135% of the propeller blade length or less, 130% of the propeller blade length or less, 125% of the propeller blade length or less, 120% of the propeller blade length or less, 115% of the propeller blade length or less, no % of the propeller blade length or less, 100% to 105% of the propeller blade length, or have any other suitable length. However, the distance can have any other suitable set of dimensions.

The mounting point preferably mounts the respective rotor blade set such that the respective rotor rotational plane is substantially parallel the central broad plane of the frame and/or housing, but can alternatively mount the rotor blade set such that the respective rotor rotational plane is tilted (e.g., at a non-zero angle to) the central broad plane of the frame and/or housing, or mount the rotor blade set in any other suitable manner. In one variation, the mounting point mounts the rotor blade set such that the respective rotor rotational plane is parallel to and offset from the bottom housing surface. The distance between the bottom housing surface and the rotor rotational plane is preferably determined based on the rotor length, but can alternatively be determined based on the rotor type or otherwise determined. The distance can be a proportion of the rotor length (e.g., approximately 5% of the rotor length, 10% of the rotor length, 25% of the rotor length, 50% of the rotor length, 100% of the rotor length, etc.), or be otherwise determined.

The frame 123 preferably includes a mounting point for each rotor blade set, but can alternatively include any suitable number of mounting points. When the frame 123 includes multiple mounting points, adjacent mounting points are preferably separated by a distance equal to or longer than the rotor length, but can alternatively be shorter. Multiple mounting points preferably mount adjacent rotor blade sets such that the respective rotor rotational planes are substantially coplanar (e.g., within 10%, 5%, etc. of coplanarity), but can alternatively mount the blade sets with the respective rotor rotational planes: substantially parallel but offset, at a predetermined angle relative to other rotor rotational planes, or in any other suitable configuration.

The lift mechanism 130 of the aerial system functions to provide lift and/or thrust for the aerial system. The lift mechanism 130 can additionally function to cool the aerial system components (e.g., processing system 110, communications system, etc.), the housing interior, or perform any other suitable functionality. The aerial system can include one or more lift mechanisms acting in concert or independently.

The lift mechanism 130 can include a set of rotor blades, each driven by one or more motors. The lift mechanism 130 can be mounted to the mounting point of the frame 123, be mounted to the main housing 120, or be mounted to any other suitable mounting surface. In a first variation, the motor is statically mounted to the mounting point (e.g., adhered, screwed, clipped, etc.), while the rotors are rotatably mounted to the motor. In a second variation, the rotors are rotatably mounted to the mounting point, while the motor can be drivably connected to the rotors through an axle, transmission, or other force transmission system. However, the lift mechanism 130 can be otherwise mounted to the housing 120.

The rotor blades of the lift mechanism 130 function to move a mass of air to generate thrust and/or to cool the heat-generating component. The rotor blades are preferably airfoils, but can have any other suitable construction. The rotor blades can be fixed pitch or adjustable pitch. The rotor blade can have a high aspect ratio, a low aspect ratio, or any other suitable aspect ratio. The rotor blade can have a large camber, low camber, or any other suitable camber. The rotor blade can be symmetric, asymmetric, or have any other suitable symmetry. The rotor blade can be passive or be active (e.g., actively controlled). The rotor blade is preferably a substantially solid piece, but can alternatively include trailing edge flaps or have any other suitable actuatable element. The rotor blade can be twisted along the rotor blade longitudinal axis, substantially planar along the longitudinal axis, or be otherwise configured. The rotor blade tip can have an upturned proplet (e.g., winglet), downturned proplet, bi-directional proplet, flat tip, shaped tip (e.g., including features that reduce turbulence), or have any other suitable tip. The transition between the rotor blade body and the proplet can be gradual (e.g., curved, have a large transition radius), sharp (e.g., have a small transition radius), or have any other suitable characteristic. The rotor blade can include sweep features along the leading edge and/or trailing edge, wherein the sweep feature can begin from the tip and extend along a portion of the rotor blade length (e.g., 100%, 90%, 80%, etc.). The sweep feature can be less than, equal to, or greater than 5% of the blade length. Alternatively, the rotor blade can exclude sweep features.

In one variation, the rotor blade has a large camber, small thickness, high lift coefficient, and high lift-to-drag ratio under laminar conditions (e.g., low Reynolds number conditions). In a specific example, the rotor blade has a diameter of 60-120 millimeters and a chord length of 25 mm or less.

The lift mechanism 130 can include two blades, four blades, six blades, or any suitable number of blades. The blades are preferably substantially equally arcuately distributed about the rotational axis, but can be unevenly distributed about the rotational axis. The blades can be statically mounted relative to the remainder of the blade set, or be actuatably mounted relative to the remainder of the blades within the blade set.

The aerial system can include one or more lift mechanisms. Each lift mechanism 130 is preferably individually indexed and individually controlled, but can alternatively be controlled together or be otherwise controlled.

The lift mechanisms 130 preferably include one or more rotors driven (individually or collectively) by one or more motors. Each rotor is preferably configured to rotate about a corresponding rotor axis 132, define a corresponding rotor plane 133 normal to its rotor axis 132, and sweep out a swept area 134 on its rotor plane 133. The motors are preferably configured to provide sufficient power to the rotors to enable aerial system flight, and are more preferably operable in two or more modes, at least one of which includes providing sufficient power for flight and at least one of which includes providing less power than required for flight (e.g., providing zero power, providing 10% of a minimum flight power, etc.). The power provided by the motors preferably affects the angular velocities at which the rotors rotate about their rotor axes 132. During aerial system flight, the set of rotors are preferably configured to cooperatively or individually generate (e.g., by rotating about their rotor axes 132) substantially all (e.g., more than 99%, more than 95%, more than 90%, more than 75%) of the total aerodynamic force generated by the aerial system (possibly excluding a drag force generated by the body such as during flight at high airspeeds). Alternatively or additionally, the aerial system can include any other suitable flight components that function to generate forces for aerial system flight, such as jet engines, rocket engines, wings, solar sails, and/or any other suitable force-generating components.

In one variation, the aerial system can be a quadcopter, and include four rotor blade sets, each arranged in a quadrant of the aerial system. The four rotors are preferably substantially evenly dispersed about the aerial system housing 120, but can alternatively be unevenly dispersed. In a specific example, the housing length can be substantially equal to four times the rotor blade length (e.g., equal to 4 times, 5 times, 4.5 times, 3.75 times, 3.5-5 times, etc.), wherein each rotor is mounted to a mounting point substantially one rotor blade length away from a housing edge (e.g., 1 length away, 1.2 lengths away, 1.5 lengths away, 0.9-1.3 lengths away, etc.). However, the rotors can be otherwise mounted and/or dispersed about the aerial system. The planes of rotor rotation are preferably substantially parallel (e.g., within 10 degrees) a lateral plane (e.g., the central broad plane) of the main housing (e.g., encompassing the longitudinal and lateral axes), but can alternatively be tilted or otherwise arranged. The rotors preferably occupy a relatively large portion of the entire aerial system (e.g., 90%, 80%, 75%, or majority of the aerial system footprint, or any other suitable proportion of the aerial system). For example, one or more rotor size metrics (e.g., the sum of the square of the diameter of each rotor, the sum of the swept area 134 of each rotor, the diameter of one or more rotors, etc.) can be greater than a threshold amount (e.g., 10%, 40%, 50%, 60%, 75%, 90%, 100%, 110%, etc.) of a total system size metric. For example, the total system size metric can be the area of the convex hull of the projection of the aerial system onto a primary plane of the system (e.g., the lateral plane, a rotor plane 133, etc.), a characteristic length (e.g., longest dimension, mean length dimension, side length of a substantially square convex hull, etc.) of the convex hull, a housing length, housing area, housing volume, and/or any other suitable metric. However, the rotors can be otherwise arranged. In this variation, two of the rotors rotate in a counterclockwise direction and two of the rotors rotate in a clockwise direction. The rotors are preferably arranged with the clockwise rotors immediately adjacent the counterclockwise rotors (e.g., such that the clockwise and counterclockwise rotors alternate about the housing 120; such that the rotors of each pair diagonally oppose each other across the main housing 120, etc.), but can alternatively be arranged with the rotors within each pair adjacent (e.g., along a single side of the aerial system, along the front or back of the aerial system, etc.), or be otherwise arranged.

4. Method of System Operation

Figure 16:
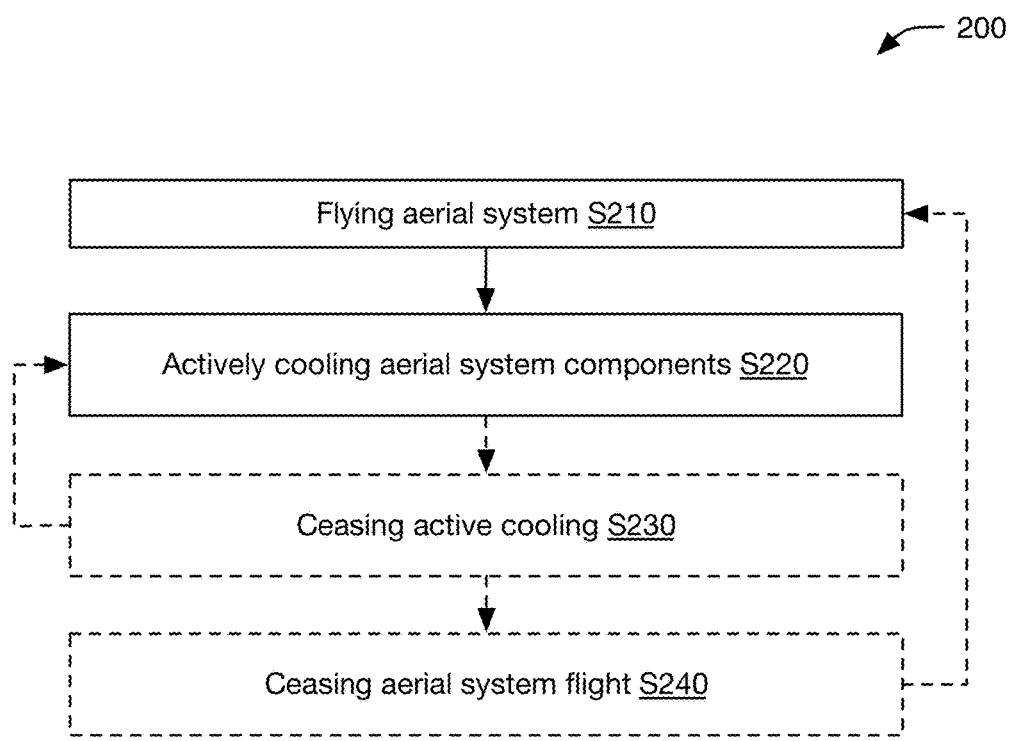
FIG. 16 is a schematic representation of the method.

As shown in FIG. 16, a method for system operation 200 can include: flying an aerial system S210 and actively cooling components of the aerial system S220. The method can optionally include ceasing active cooling S230 and/or ceasing aerial vehicle flight S240. The method is preferably performed using the aerial system 100, but can additionally or alternatively be performed using any other suitable system.

Flying the aerial system S210 functions to operate the aerial system in a flight mode. S210 preferably includes operating the lift mechanisms (e.g., rotors) in a flight mode, but can additionally or alternatively include operating any other suitable aerial system components in a flight mode. The aerial system is preferably automatically operated by the processing system, but can alternatively be automatically operated by the remote computing system or by any other suitable system. The aerial system is preferably operated according to a set of operation parameters, wherein the operation parameters can be predetermined, selected (e.g., based on the sensor measurement combination at the time of or preceding change detection; based on the classification of the sensor measurement patterns or combination; etc.), or otherwise determined. The operation parameters can include: power provided to the lift mechanism (e.g., voltage, current, etc.), lift mechanism speed or output, timing, target sensor measurements, or any other suitable operation parameter.

The aerial system can operate in the flight mode using signals from: a front-facing camera, a downward-facing camera, orientation sensors, a laser system (e.g., rangefinder, LIDAR), radar, stereocamera system, time of flight, or any other suitable optical, acoustic, rangefinding, or other system. The aerial system can process the signals using RRT, simultaneous localization and mapping (SLAM), kinematics, optical flow, machine learning, rule-based algorithms, or any other suitable method. The operation modes for the aerial system can include: a remote control (RC) operation mode, an object detection mode (e.g., automatically identifying, classifying, tracking, and/or performing other processes for environmental objects determined based on a recorded set of images), a path movement mode (e.g., automatically performing path-planning for the aerial system based on sampled sensor signals and/or other data), an automatic operation mode (e.g., concurrently performing one or more of the aforementioned modes to automatically operate the aerial system), assisted RC mode (e.g., concurrently performing one or more of the aforementioned modes while operating according to remote operation instructions), or include any other suitable operation mode.

The flight mode preferably includes a hover mode in which the aerial system position in the air (e.g., vertical position, lateral position, etc.) is substantially maintained, but can alternatively be any other suitable flight mode. The flight mode preferably includes maintaining an aerial system orientation such that a central axis normal to a lateral plane of the aerial system is substantially parallel to a gravity vector (e.g., within 20°, within 10°, within 3°, within 1°, etc.). However, the central axis can be otherwise maintained. The flight mode preferably includes generating a force at the lift system equal and opposite the force exerted on the aerial system by gravity (e.g., to hover), but can alternatively include generating a vertical force greater or lesser than the gravitational force (e.g., to increase or decrease altitude, and/or to arrest vertical movement and bring the aerial system into a hovering state). The flight mode can additionally or alternatively include generating a non-vertical force and/or a torque (e.g., to change the aerial system pitch or roll, to cause or arrest lateral movement, etc.). For example, the flight mode can include detecting an orientation, position, and/or velocity change, determining that the change is due to wind and/or another external perturbation such as a collision (e.g., classifying the change as a wind and/or collision event, determining a probability of wind perturbation, determining a probability of the perturbation being a grab event, etc.), and operating the lift mechanism to correct for the change and return to an original or desired position, orientation, and/or velocity.

The flight mode can additionally or alternatively include a path movement mode (e.g., flying in a straight line; flying along a predetermined path; navigating the aerial system through its surroundings, such as based on SLAM and/or other sensor measurement analysis; etc.), a program mode (e.g., flying along a path determined dynamically based on a flight program; flying based on facial and/or body tracking such as following or orbiting around a person or maintaining the person's face within a camera field of view, preferably tracked using the processing system; etc.), and/or any other suitable mode. The flight mode can optionally include capturing an image (e.g., storing a single image, streaming a video, etc.) using an aerial system camera mounted (or otherwise mechanically coupled) to the body.

In a specific example, the path movement mode includes sampling a series of images with a front-facing camera and automatically determining the aerial system physical position within a 3-D space using the series of images and a location method (e.g., SLAM) running on-board the aerial system. In a second specific example, the path movement mode includes sampling a series of images with a down-facing camera (e.g., sampling at 60 fps, or at any other suitable frequency), automatically detecting apparent movement between the aerial system and the ground based on the sampled images (e.g., using optical flow), which can assist in determining aerial system position or kinematics (e.g., speed, acceleration), and automatically correcting the aerial system balance or position based on the detected apparent movement. In a third specific example, the aerial system location, determined using the first specific example, and the aerial system kinematics, determined using the second specific example, can be fed into a flight control algorithm to hover, fly, or otherwise control the aerial system.

The flight mode can additionally or alternatively include an imaging mode, wherein the aerial system automatically identifies an imaging target (e.g., person, face, object, etc.), preferably using the processing system, and controls its flight to automatically follow the imaging target through a physical space. In one variation, the aerial system can run object recognition and/or tracking methods, facial recognition and/or tracking methods, body recognition and/or tracking methods, and/or any other suitable method on the sampled images (e.g., from the front-facing camera) to identify and track the imaging target. In a specific example, the aerial system can automatically image a substantially 360° region about itself (e.g., by rotating about the central axis, by moving the camera around, by using a 360° camera, etc.), automatically identify imaging targets from the image, and automatically follow an imaging target (e.g., automatically identified or manually selected) about the physical space. However, the imaging mode can be otherwise performed. However, the flight mode can include any other suitable set of operation modes.

The aerial system can be operated in the flight mode by independently controlling the angular velocity of each rotor and/or the power delivered to each rotor. However, the rotors can be controlled as a group or in any other suitable manner. S120 preferably includes generating an aerodynamic force at the set of rotors that is substantially equal to the total aerodynamic force generated by the aerial system, more preferably also substantially equal to the net force exerted by the aerial system (e.g., wherein the aerial system does not include any other components configured to generate significant aerodynamic force, or to otherwise exert significant force, such as propulsive force, on the ambient environment).

In one variation, operating the aerial system in the flight mode can include spooling up the rotor angular velocity of each rotor to a flight rotor speed (e.g., at which the set of rotors generates a flight aerodynamic force) from a standby rotor speed (e.g., at which the set of rotors generates a standby aerodynamic force lower than the flight aerodynamic force, such as substantially zero force or a small fraction of the flight aerodynamic force). In this variation, the flight rotor speed is preferably the hover rotor speed at which the aerial system hovers; alternatively the speed can be any other suitable rotation speed. The flight speed can be preset (e.g., by a manufacturer), received from the client, automatically determined (e.g., based on the rate of signal change), or otherwise determined. The standby rotor speed can be low speed (e.g., a proportion of the hover speed), substantially zero angular velocity (e.g., wherein the rotors are not rotating), or have any other suitable speed. The standby rotor speed can be preset (e.g., by a manufacturer), received from the client, or otherwise determined. The rotor speed can be immediately transitioned from the standby rotor speed to the flight rotor speed, transitioned based on the rate of orientation sensor signal change, transitioned at a predetermined rate, or transitioned in any other suitable manner.

Actively cooling components of the aerial system S220 functions to remove heat from the components, which can enable greater heat generation at the components, increase component performance, and/or prevent component damage. The actively cooled components preferably include heat-generating and/or heat-sensitive components. The components to be actively cooled preferably include electronic components, such as the processing system (e.g., processor), power supply, sensors, and/or communication system. However, S220 can include actively cooling any suitable components. S220 can be performed concurrently with S210 (e.g., with specific modes, with all modes, etc.), asynchronously from S210, constantly during aerial system flight, in response to determination of a trigger event (e.g., overheating event), and/or at any other suitable time. S220 can include dynamically controlling system operation (e.g., as described below) and/or performing any other suitable cooling operations.

In a first variation, the components are actively cooled S220 as a result of aerial system flight. For example, both aerial system flight S210 and component active cooling S220 can be achieved by forcing fluid flow (e.g., airflow) along fluid flow paths 10. In this variation, flight control (e.g., lift mechanism control) can optionally be dynamically altered to control the active cooling (e.g., to start or increase active cooling). In one example, lift mechanism (e.g., rotor) operation for flight can cause cooling fluid (e.g., air) to flow past the components (e.g., as a secondary consequence of propulsive airflow caused by the lift mechanism). In a specific example (e.g., as shown in FIG. 8), air and/or other fluid is forced through the lift mechanism (e.g., through an upper broad surface of the frame, then the swept area of a rotor, and then a lower broad surface of the frame) along a propulsion airflow vector 11 (e.g., downward vector, vector substantially normal a broad face of the aerial system, etc.), thereby controlling aerial system flight. In this specific example, the airflow continues from the lift mechanism to a region past (e.g., farther along the propulsion airflow vector 11) a portion of the aerial system (e.g., past the lift mechanism, frame, housing, entire aerial system, etc.). In this specific example, the airflow turns within the region (e.g., toward the components to be cooled, such as the processor) and proceeds along a cooling airflow vector 12 (e.g., upward vector, lateral vector, vector at an oblique angle to the propulsion airflow vector, vector directed from the region toward the processor, etc.). The inner product of the propulsion and cooling airflow vectors is preferably negative, but can alternatively be positive, substantially zero, or have any other suitable value.

In a second variation, aerial system flight and active cooling of the components can be controlled independently. However, aerial system flight and/or active cooling can be controlled in any other suitable manner.

Figure 10:
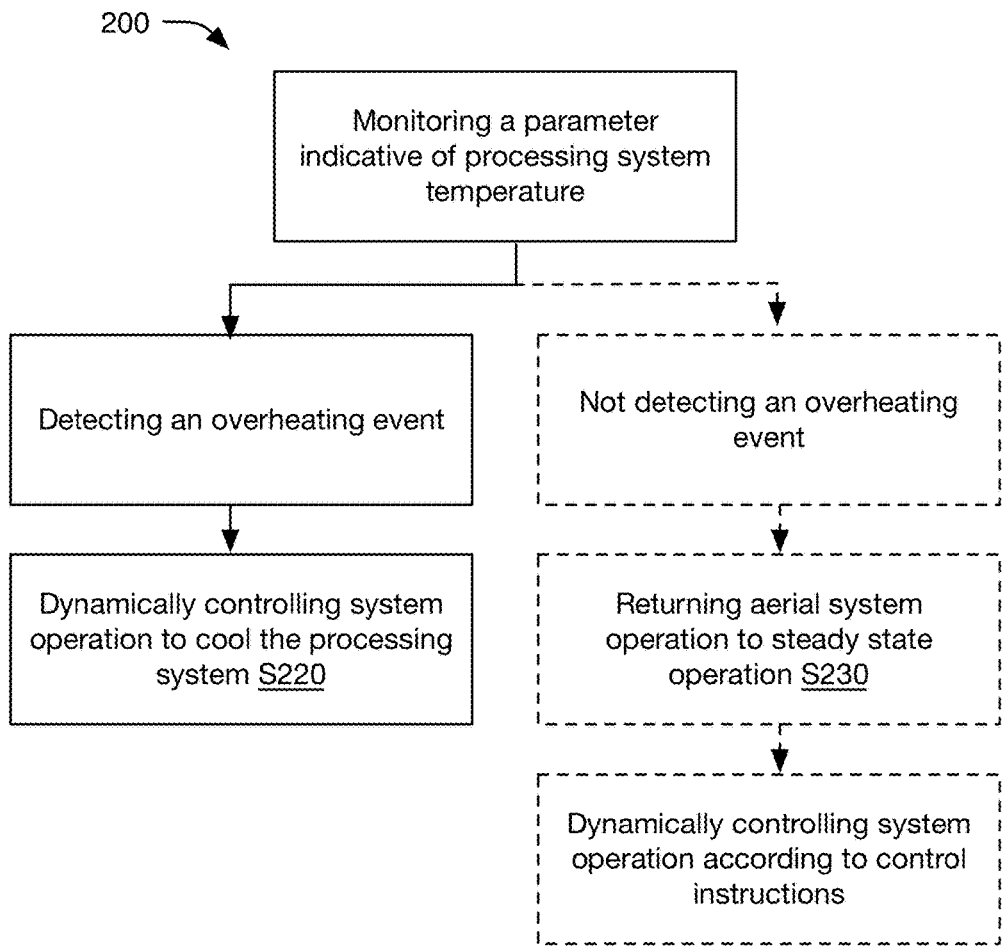
FIG. 10 is a schematic representation of an embodiment of a method for system operation.

As shown in FIG. 10, an embodiment of the method for system operation can include: monitoring a parameter indicative of heat-generating component temperature, detecting an overheating event, and dynamically controlling system operation to cool the heat-generating component. This can function to dynamically cool the heat-generating component in operation. The method is preferably performed by the processing system, but can alternatively be performed by the user device or by any other suitable system.

Monitoring a parameter indicative of heat-generating component temperature functions to monitor for an overheating event. This can be performed by the processing system, user device, or by any other suitable system. The parameter is preferably constantly monitored for the overheating event, but can alternatively be periodically monitored for the overheating event, monitored in response to the occurrence of a monitoring event, or monitored at any suitable time. The monitoring event can include: aerial system operation, heat-generating component power consumption above a threshold consumption level, or any other suitable event. Monitoring the parameter can include: receiving signals for the parameter and processing signals for the parameter, or otherwise monitoring the parameter. Processing signals for the parameter can include determining a parameter value based on the signal value and evaluating whether the parameter value(s) indicate an overheating event. One or more signals from one or more sensors and/or operation parameters can be used to monitor the parameter indicative of heat-generating component temperature.

In a first variation, the parameter can be a component operation parameter (e.g., processor operation parameter). In a first embodiment, the component operation parameter includes the current processing load, as determined based on the current power draw, current number of tasks to be completed by the heat-generating component, current processor load (e.g., % CPU being used), and/or any other suitable variable.

Figure 13:
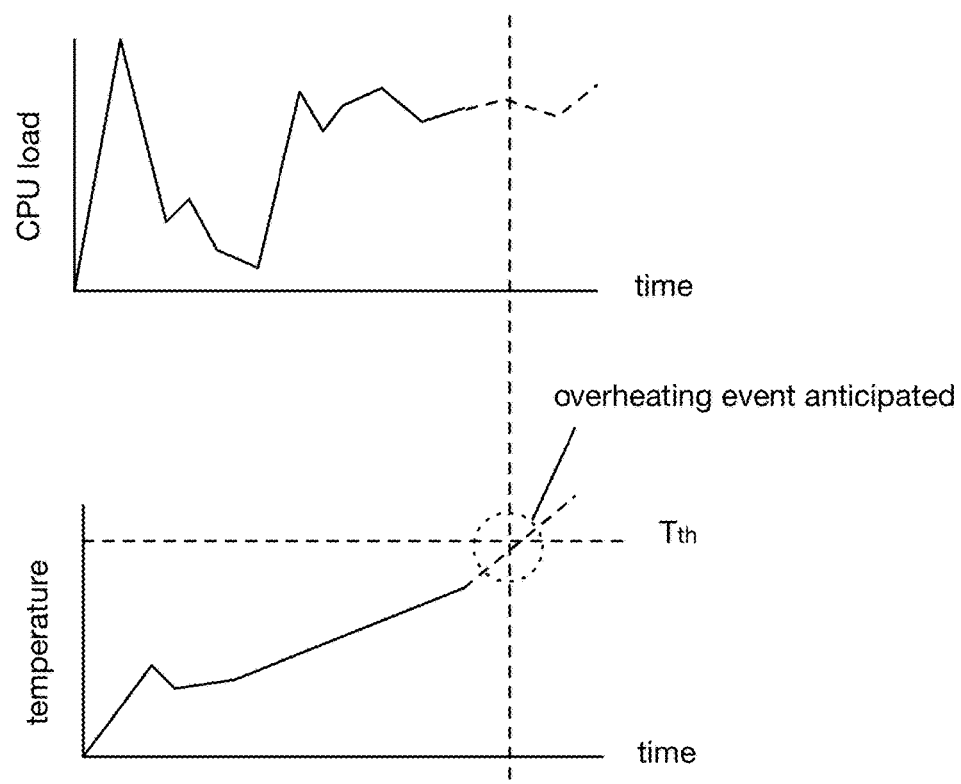
FIG. 13 is a third specific example of detecting the overheating event based on an anticipated processing load.

In a second embodiment, the component operation parameter includes the anticipated processing load, as determined based on the number of tasks in a task queue, the type of tasks, the anticipated tasks (e.g., as determined based on contextual factors, such as location, time of day, user controlling the aerial system, aerial system flight status such as orientation and/or speed, etc.), and/or based on any other suitable variable (example shown in FIG. 13).

In a third embodiment, the component operation parameter includes the heat-generating component temperature, as determined from measurements received from a temperature sensor thermally coupled to the heat-generating component.

In a fourth embodiment, the component operation parameter includes the actual and/or estimated cooling fluid flow rate proximal the heat-generating component, as determined from a flow rate sensor fluidly coupled to a physical volume proximal (e.g., adjacent) the processor. In one example, the flow rate sensor is fluidly connected to the flow channels defined between the fins of the heat exchanger. In a second example, the flow rate sensor is fluidly connected to the cooling channel of the housing. However, the flow rate sensor can be otherwise arranged.

In a fifth embodiment, the component operation parameter includes the actual and/or estimated amount of heat emitted by the processing system, as determined from heat measurements (e.g., IR measurements, temperature measurements, etc.) recorded by a remote computing system. However, the component operation parameter can be otherwise determined.

In a second variation, the parameter can be an ambient environment parameter. The ambient environment parameter can be for an instantaneous location (e.g., volume adjacent the aerial system), an anticipated location (e.g., volume proximal the aerial system, along a traversal path), or for any other suitable physical space.

In a first embodiment, the ambient environment parameter can be the ambient environment temperature (e.g., as determined from the temperature acquired by on-board temperature sensors). The temperature sensors can be arranged in a location removed from the cooling fluid flow path (e.g., rotor flow path), in a location within the cooling fluid flow path (e.g., within the rotor flow path), or in any other suitable location. Examples of temperature sensor locations include the frame exterior sides, the exterior of the housing top broad surface, the exterior of the housing bottom surface, or any other suitable location.

In a second embodiment, the ambient environment parameter can be the ambient environment flow rate (e.g., as determined from the flow rate acquired by on-board flow sensors). This can function to measure external fluid flow, such as wind speed. The flow sensors are preferably arranged on the exterior of the housing, but can alternatively be arranged along the interior. Examples of flow sensor locations include: within the cooling channel 122, along the housing top broad surface, along the housing bottom broad surface, along the frame sides, or along any other suitable surface.

In a third embodiment, the ambient environment parameter can be the anticipated ambient environment temperature (e.g., as determined from temperature measurements acquired by a remote heat sensor on-board the aerial system). The remote heat sensor can be the camera (e.g., wherein the camera can record light within the infrared range, include an IR sensor, etc.), or be any other suitable heat sensor.

However, any other suitable parameter can be monitored for the overheating event.

Detecting the overheating event functions to detect an occurrence indicating an increased cooling need. The overheating event can be determined by the processing system, a remote computing system, or by any other suitable system. The overheating event is preferably determined based on the values of the monitored parameter value, but can alternatively be otherwise determined. The overheating event can be an event indicative of imminent processing system overheating, current processing system overheating, or of any other suitable overheating event.

Figure 12:
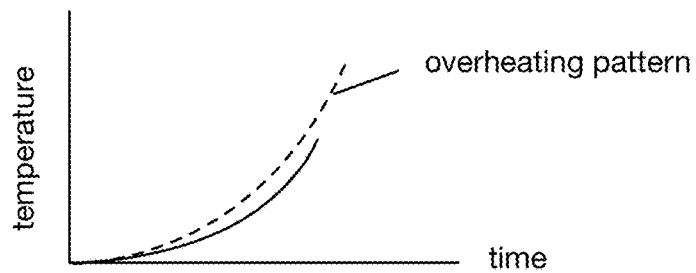
FIG. 12 is a second specific example of detecting the overheating event when the parameter pattern substantially matches a predetermined parameter pattern.

In a first variation, an overheating event is detected when the parameter values substantially match (e.g., within a margin of error, such as 5%) a predetermined pattern associated with an overheating event (example shown in FIG. 12). The predetermined pattern can be empirically determined, learned (e.g., using machine learning techniques), received from a user, or otherwise determined. In one embodiment, the parameter values under analysis include a time-ordered series of values for the same parameter. In a second embodiment, the parameters values under analysis include values of multiple parameters, recorded within a threshold time window of each other. However, any suitable set of parameter values can be analyzed.

Figure 11:
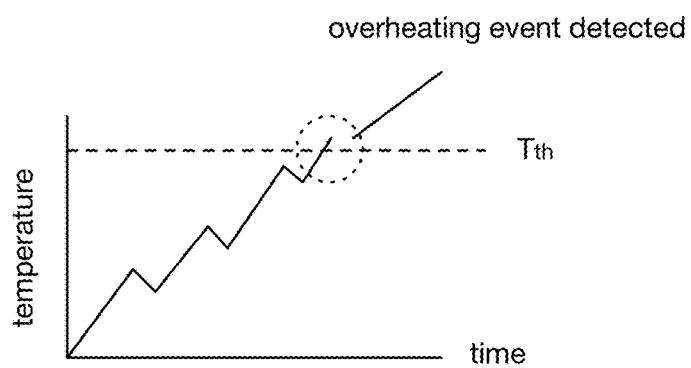
FIG. 11 is a first specific example of detecting the overheating event when the parameter exceeds a threshold parameter value.

In a second variation, an overheating event is detected when the parameter value surpasses a threshold value. The threshold value can be empirically determined, learned, received from a user, selected based on the anticipated cooling needs (e.g., determined based on the processing load, the anticipated ambient environment temperature, etc.), or otherwise determined. In a first example, an overheating event can be detected when the instantaneous temperature exceeds a threshold temperature (example shown in FIG. 11). In a second example, an overheating event can be detected when the flow rate proximal the heat-generating component falls below a threshold flow rate. In a third example, an overheating event can be detected when the anticipated temperature within a predetermined amount of time, as determined based on the current rate of temperature increase and the current temperature, exceeds the threshold temperature.

However, occurrence of the overheating event can be otherwise determined.

Dynamically controlling system operation to cool the heat-generating component functions to cool the heat-generating component. The components can be cooled as discussed above regarding S220 and/or cooled in any other suitable manner. The heat-generating component can be cooled anticipatorily (e.g., before the cooling is needed), concurrently as the cooling is needed (e.g., such that the cooling rate is ramped up with the heat-generating component thermal load), after the cooling is needed (e.g., after the heat-generating component has overheated), or at any suitable time. The heat-generating component can be cooled based on the monitored parameter value (e.g., used to detect the overheating event), be cooled independent of the monitored parameter value, or otherwise cooled. The monitored parameter value can be used to determine the amount of system parameter change (e.g., wherein the amount of system parameter change can be calculated, selected, or otherwise determined based on the monitored parameter value), select the type of system parameter change, or otherwise influence the amount of system parameter change.

In a first variation, dynamically operating the system in response to overheating event detection can include adjusting heat-generating component operation.

In a first embodiment, adjusting heat-generating component operation includes decreasing the number of tasks being concurrently performed. In one example, this can include reducing the communication rate (e.g., the rate at which packets are transmitted from the communication system). In a second example, this can include prioritizing the tasks to be performed, and only performing tasks above a threshold priority level. However, the number of tasks can be otherwise decreased.

In a second embodiment, adjusting heat-generating component operation includes selecting a different technique or processing method. The different technique or processing method is preferably less processor- and/or power-intensive, but can be otherwise related to the first technique or processing method. The different technique or processing method can be slower than the first technique or processing method, less accurate than the first technique or processing method, or otherwise related to the first technique or processing method.

In one example, selecting a different technique or processing method can include switching from dynamically stabilizing every frame of a recorded video based on accelerometer measurements associated with the respective frame to cropping each frame based on a predetermined cropping pattern. In a second example, selecting a different technique or processing method can include lowering the frame processing frequency. In a third example, selecting a different technique or processing method can include switching from digital image processing to analog image processing (e.g., using hardwired circuitry). In a fourth example, selecting a different technique or processing method can include switching from using a convolutional neural network to identify objects and/or targets to a rule-based method of identifying objects and/or targets. In a fifth example, selecting a different technique or processing method can include delegating processing tasks to auxiliary computing systems (e.g., remote computing systems). The auxiliary computing systems can have more efficient processing systems (e.g., dedicated hardware), cooling systems, low thermal loads, or any other suitable set of parameters. The auxiliary computing systems can optionally be selected (e.g., by the processing system, a remote computing system, etc.) for task performance based on said parameter values. In a specific example, this can include delegating the image stabilization, analysis (e.g., object identification, tracking, etc.), or other image processing tasks to a remote user device, wherein the aerial system streams the raw or downsampled images to the remote user device. However, different processing methods can be otherwise selected.

However, heat-generating component operation can be otherwise adjusted.

In a second variation, dynamically operating the system in response to overheating event detection can include increasing the cooling fluid flow rate.

Figure 15:
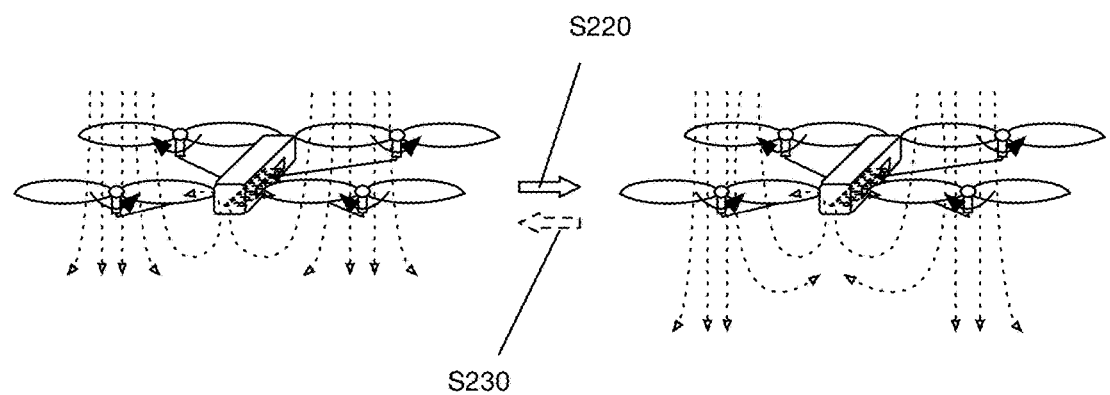
FIG. 15 is a schematic representation of a second variation of dynamically operating the aerial system.

In a first embodiment, increasing the cooling fluid flow rate includes increasing the rotor rotation speed (example shown in FIG. 15). In a first example, the rotor rotation speed can be increased until the monitored parameter value satisfies a desired condition (e.g., falls within a predetermined range, falls below a threshold, etc.). In this example, secondary rotors can be optionally operated to counteract the thrust effects from increasing the rotor rotation speed. In a specific example, a second rotor coaxially mounted to and opposing the cooling rotor can be operated to generate a similar amount of thrust as the cooling rotor to counteract the thrust generated by increased cooling rotor operation. In a second example, the target rotor rotation speed can be determined (e.g., calculated, selected, etc.) based on a set of control instructions. In a specific example, the target rotor rotation speed can be within a range of a rotation speed determined based on the control instructions. The range can be predetermined, specified by the control instructions, calculated based on the instructed rotation speed (e.g., 5% of the instructed speed), or otherwise determined. In a third example, the rate of rotor rotation speed increase can be determined based on the anticipated cooling needs. In a specific example, this can include: determining the anticipated cooling requirement in a predetermined amount of time (e.g., based on the monitored parameter), determining the rotation speed required to meet the anticipated cooling requirement and gradually ramping up the rotation speed to meet the required rotation speed within the predetermined amount of time. However, the rotor rotation speed and/or rate of change can be otherwise determined. However, the rotor rotation speed can be otherwise adjusted to cool the heat-generating component.

Figure 14:
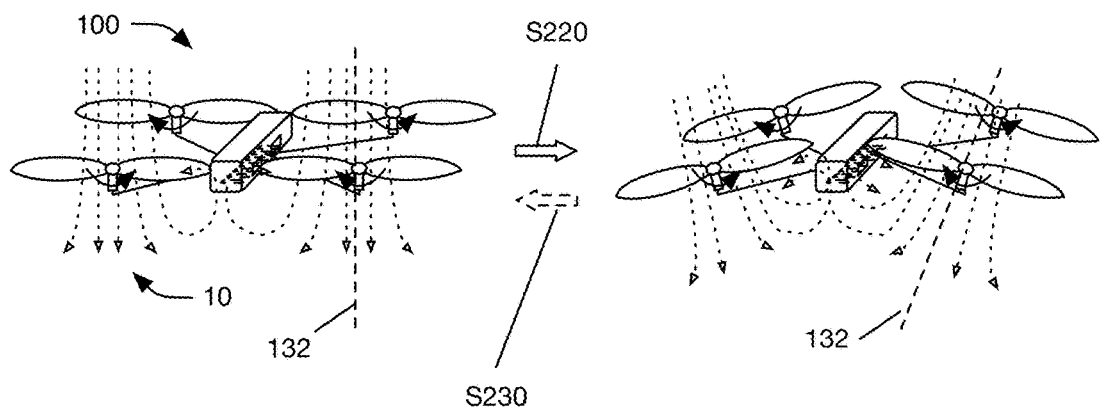
FIG. 14 is a schematic representation of a first variation of dynamically operating the aerial system.

In a second embodiment, increasing the cooling fluid flow rate includes adjusting the angle of the rotor rotation axis. This can include: tilting the mounting point (e.g., using an auxiliary motor, a passive system, etc.) to tilt the rotor rotation axis toward the bottom of the housing (example shown in FIG. 14), toward the top of the housing, or in any other suitable direction. This can additionally include compensating for flight effects due to the adjustment, which can include: tilting the rotation axis of an opposing rotor in an opposing direction, selectively increasing or decreasing the rotation speed of opposing rotors, or otherwise compensating for the effects of tilting the rotational axis. However, the rotor rotation axis can be otherwise adjusted.

In a third embodiment, increasing the cooling fluid flow rate includes opening or constricting the cooling channels (e.g., to increase channel conductance, to promote a Venturi effect, etc.). In one example, each cooling channel can include a valve arranged in series with the cooling channel (e.g., along the cooling channel length), wherein constricting the cooling channel can include partially closing the valve. In a second example, each cooling channel can be made from a multi-state material (e.g., shape-memory alloy such as nitinol), wherein application or removal of an applied force (e.g., current, voltage, etc.) changes the channel from a first configuration to a second configuration. However, the cooling channels can be otherwise constricted.

In a fourth embodiment, increasing the cooling fluid flow rate includes decreasing the pressure within the housing. In a first example, this includes generating a suction force to remove fluid from the housing lumen. The suction force can be generated by the cooling rotor, a secondary rotor, a fan, ambient air flowing by the aerial system, or otherwise generated. This can additionally include selectively closing some or all of the cooling channels of the housing. However, the housing pressure can be otherwise decreased.

The method can additionally include dynamically operating the aerial system according to control instructions when an overheating event (e.g., current or imminent) is not detected. In a specific example, the method can include detecting an overheating event and actively cooling the heat-generating components in response, then detecting that the overheating event has passed (e.g., has been averted, has ended, etc.), and, in response, ceasing the active cooling. The control instructions can be received from a remote computing system, automatically generated (e.g., based on object tracking, automatic landing path determination, automatic stabilization, etc.), or otherwise determined. Dynamically operating the aerial system can additionally include returning aerial system operation to steady state operation, which can include: increasing the processing load, decreasing the cooling fluid flow rate (e.g., decreasing the rotor rotation rate, decreasing the aerial system translation speed, realigning the rotor rotational axis, opening the cooling channels, etc.), or otherwise operating the aerial system.

Although omitted for conciseness, the preferred embodiments include every combination and permutation of the various system components and the various method processes. Furthermore, various processes of the preferred method can be embodied and/or implemented at least in part as a machine configured to receive a computer-readable medium storing computer-readable instructions. The instructions are preferably executed by computer-executable components preferably integrated with the system and one or more portions of the processing system. The computer-readable medium can be stored on any suitable computer readable media such as RAMs, ROMs, flash memory, EEPROMs, optical devices (CD or DVD), hard drives, floppy drives, or any suitable device. The computer-executable component is preferably a general or application specific processing subsystem, but any suitable dedicated hardware device or hardware/firmware combination device can additionally or alternatively execute the instructions.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. An aerial vehicle comprising:
    a set of rotors, each rotor of the set defining a respective rotor axis, a respective rotor plane normal to the respective rotor axis, and a respective swept area within the respective rotor plane, wherein the rotor axes are substantially non-collinear;
    a processor configured to control the set of rotors for aerial vehicle flight;
    a housing defining a housing interior and a plurality of cooling channels, the housing interior fluidly coupled to an ambient environment by the plurality of cooling channels, the processor arranged within the housing interior, each rotor of the set rotationally coupled to the housing about the respective rotor axis; and a rotor housing mechanically coupled to the housing, the rotor housing enclosing a rotor of the set and defining a plurality of airflow apertures fluidly connecting the rotor to an ambient environment, wherein each aperture is smaller than a threshold size;

wherein:

for each rotor of the set, a projection of the processor and the cooling channels onto the respective rotor plane does not intersect the respective swept area; and a distance from the rotor axis of a first rotor of the set to a cooling channel of the plurality is less than 75% of a rotor diameter of the first rotor.

2. The aerial vehicle of claim 1, wherein the rotor axes of the set of rotors are substantially parallel.

3. The aerial vehicle of claim 2, wherein the swept areas of the set of rotors are substantially coplanar.

4. The aerial vehicle of claim 3, wherein the aerial vehicle defines a lateral plane intersecting the processor and each rotor of the set.

5. The aerial vehicle of claim 3, wherein:

the set of rotors comprises four rotors; and for each rotor of the set, a respective rotor diameter is greater than 40% of a longest dimension of a convex hull of a projection of the aerial system onto the respective rotor plane.

6. The aerial vehicle of claim 1, wherein the processor is arranged within a convex hull of the rotor axes of the set of rotors.

7. The aerial vehicle of claim 1, wherein a processor distance from the rotor axis of the first rotor to the processor is less than 75% of a rotor diameter of the first rotor.

8. The aerial vehicle of claim 1, wherein, for each rotor of the set, a sum of the swept areas of the set of rotors is greater than 50% of an area of a convex hull of a projection of the aerial system onto the respective rotor plane.

9. The aerial vehicle of claim 1, further comprising a heatsink thermally coupled to a broad face of the processor, the heatsink arranged within the housing interior.

10. An aerial vehicle comprising:

a set of rotors, each rotor of the set defining a respective rotor axis, a respective rotor plane normal to the respective rotor axis, and a respective swept area within the respective rotor plane, wherein the rotor axes are substantially non-collinear;

a processor configured to control the set of rotors for aerial vehicle flight; and a housing defining a housing interior and a plurality of cooling channels, the housing interior fluidly coupled to an ambient environment by the plurality of cooling channels, the processor arranged within the housing interior, each rotor of the set rotationally coupled to the housing about the respective rotor axis;

wherein:

for each rotor of the set, a projection of the processor and the cooling channels onto the respective rotor plane does not intersect the respective swept area; and for each rotor of the set, a sum of the swept areas of the set of rotors is greater than 50% of an area of a convex hull of a projection of the aerial system onto the respective rotor plane.

11. The aerial vehicle of claim 10, wherein the rotor axes of the set of rotors are substantially parallel.

12. The aerial vehicle of claim 11, wherein the swept areas of the set of rotors are substantially coplanar.

13. The aerial vehicle of claim 12, wherein the aerial vehicle defines a lateral plane intersecting the processor and each rotor of the set.

14. The aerial vehicle of claim 13, wherein:

the set of rotors comprises four rotors; and for each rotor of the set, a respective rotor diameter is greater than 40% of a longest dimension of a convex hull of a projection of the aerial system onto the respective rotor plane.

15. The aerial vehicle of claim 14, wherein the processor is arranged within a convex hull of the rotor axes of the set of rotors.

16. The aerial vehicle of claim 10, wherein a processor distance from the rotor axis of the first rotor to the processor is less than 75% of a rotor diameter of the first rotor.

17. The aerial vehicle of claim 10, further comprising a rotor housing mechanically coupled to the housing, the rotor housing enclosing a rotor of the set and defining a plurality of airflow apertures fluidly connecting the rotor to an ambient environment, wherein each aperture is smaller than a threshold size.

18. The aerial vehicle of claim 10, further comprising a heatsink thermally coupled to a broad face of the processor, the heatsink arranged within the housing interior.

19. The aerial vehicle of claim 10, wherein a distance from the rotor axis of a first rotor of the set to a cooling channel of the plurality is less than 75% of a rotor diameter of the first rotor.

* * * * *